United States Patent
Oshige et al.

(10) Patent No.: US 12,144,194 B2
(45) Date of Patent: Nov. 12, 2024

(54) DISPLAY APPARATUS, MODULE, AND EQUIPMENT

(71) Applicant: CANON KABUSHIKI KAISHA, Tokyo (JP)

(72) Inventors: Hidemasa Oshige, Kanagawa (JP); Norihiko Nakata, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 425 days.

(21) Appl. No.: 17/345,820

(22) Filed: Jun. 11, 2021

(65) Prior Publication Data

US 2021/0408448 A1 Dec. 30, 2021

(30) Foreign Application Priority Data

Jun. 30, 2020 (JP) .................... 2020-112432

(51) Int. Cl.
*H10K 50/842* (2023.01)
*G02B 3/00* (2006.01)
*G02B 5/20* (2006.01)
*H10K 50/858* (2023.01)
*H10K 59/131* (2023.01)
*H10K 59/38* (2023.01)

(52) U.S. Cl.
CPC ..... *H10K 50/8426* (2023.02); *H10K 50/8428* (2023.02); *H10K 50/858* (2023.02); *H10K 59/131* (2023.02); *H10K 59/38* (2023.02); *G02B 3/005* (2013.01); *G02B 5/201* (2013.01)

(58) Field of Classification Search
None
See application file for complete search history.

(56) References Cited

U.S. PATENT DOCUMENTS

| | | | | |
|---|---|---|---|---|
| 5,381,255 | A * | 1/1995 | Ohnuma | G02F 1/1339 349/153 |
| 6,476,897 | B1* | 11/2002 | Watanabe | G02F 1/13454 349/139 |
| 2002/0149320 | A1 | 10/2002 | Maruyama | |
| 2010/0020263 | A1 | 1/2010 | Murao | |
| 2012/0212698 | A1* | 8/2012 | Lee | G02F 1/1341 349/138 |
| 2012/0218640 | A1 | 8/2012 | Gollier | |
| 2013/0107348 | A1* | 5/2013 | Tomotoshi | G02B 26/005 359/290 |

(Continued)

FOREIGN PATENT DOCUMENTS

| | | |
|---|---|---|
| JP | S6361285 A | 3/1988 |
| JP | H05198375 A | 8/1993 |

(Continued)

*Primary Examiner* — Khaja Ahmad
(74) *Attorney, Agent, or Firm* — Canon U.S.A., Inc. IP Division

(57) ABSTRACT

A display apparatus includes a display device and a light transmission plate overlapping the display device. The display device has a display region. A void is provided between the display region and the light transmission plate. Between the display region and the light transmission plate, a distance G from a front surface of the display device facing the void to a main surface of the light transmission plate facing the void is greater than a height difference H of the front surface in the display region. The height difference H is greater than 1 μm.

29 Claims, 10 Drawing Sheets

(56) References Cited

U.S. PATENT DOCUMENTS

| | | | |
|---|---|---|---|
| 2014/0347612 A1* | 11/2014 | Park | G02F 1/133514 |
| | | | 430/7 |
| 2018/0197906 A1* | 7/2018 | Yamaguchi | H01L 27/14627 |
| 2018/0375062 A1* | 12/2018 | Ide | H10K 59/873 |
| 2020/0052019 A1* | 2/2020 | Yeh | H01L 27/14643 |
| 2020/0133054 A1 | 4/2020 | Oshige | |

FOREIGN PATENT DOCUMENTS

| | | | |
|---|---|---|---|
| JP | 2002305076 A | 10/2002 | |
| JP | 2003187962 A | 7/2003 | |
| JP | 2004085769 A | 3/2004 | |
| JP | 2009238517 A | 10/2009 | |
| JP | 2012146497 A | 8/2012 | |
| JP | 2014513029 A | 5/2014 | |
| JP | 2020-072187 A | 5/2020 | |

\* cited by examiner

DISPLAY APPARATUS, MODULE, AND EQUIPMENT

BACKGROUND

Field

The present disclosure relates to a display apparatus.

Description of the Related Art

A display apparatus includes a light transmission plate opposed to a display device. Japanese Patent Application Laid-Open No. 2020-72187 discusses a display apparatus in which a semiconductor device including a color filter layer and a light transmission plate are bonded by a bonding member so that a void is provided between the color filter layer and the light transmission plate.

SUMMARY

According to an aspect of the present disclosure, a display apparatus includes a display device including a display region, and a light transmission plate overlapping the display device, wherein a void is provided between the display region and the light transmission plate, and wherein, between the display region and the light transmission plate, a distance G from a front surface of the display device facing the void to a main surface of the light transmission plate facing the void is greater than a height difference H of the front surface in the display region, and the height difference H is greater than 1 µm.

Further features of the present disclosure will become apparent from the following description of exemplary embodiments with reference to the attached drawings.

DESCRIPTION OF THE EMBODIMENTS

Figure 1A:
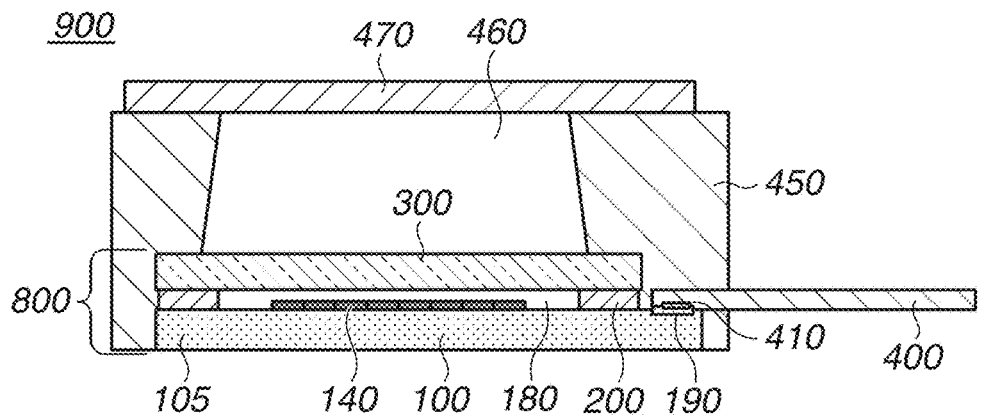
FIGS. 1A, 1B, and 1C are schematic diagrams illustrating a module and a display apparatus.

If a display apparatus is provided with a void, the reliability and display quality of the display apparatus is more likely to drop than without the void. The present disclosure is directed to providing a technique advantageous in preventing a drop in the reliability and display quality of a display apparatus.

Exemplary embodiments of the present disclosure will be described below with reference to the drawings. In the following description and the drawings, components common among a plurality of drawings are denoted by the same reference numerals. The common components will therefore be described with cross reference to a plurality of drawings, and a description of the components denoted by the same reference numerals will be omitted as appropriate.

Figure 1B:
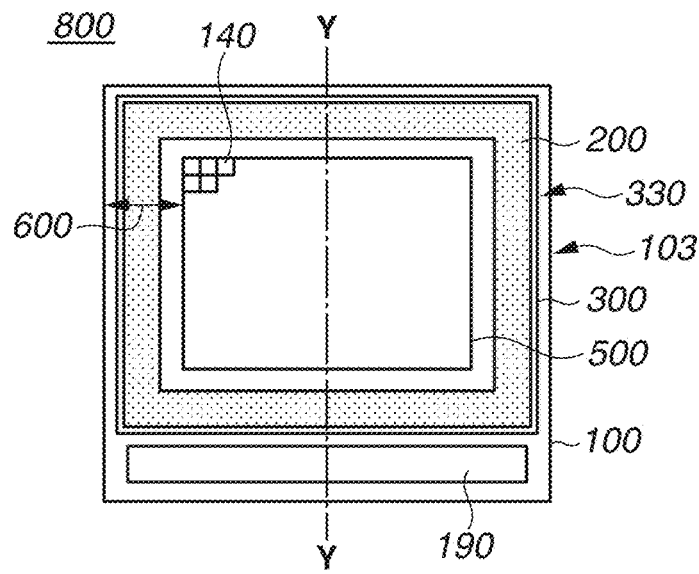
Figure 1C:
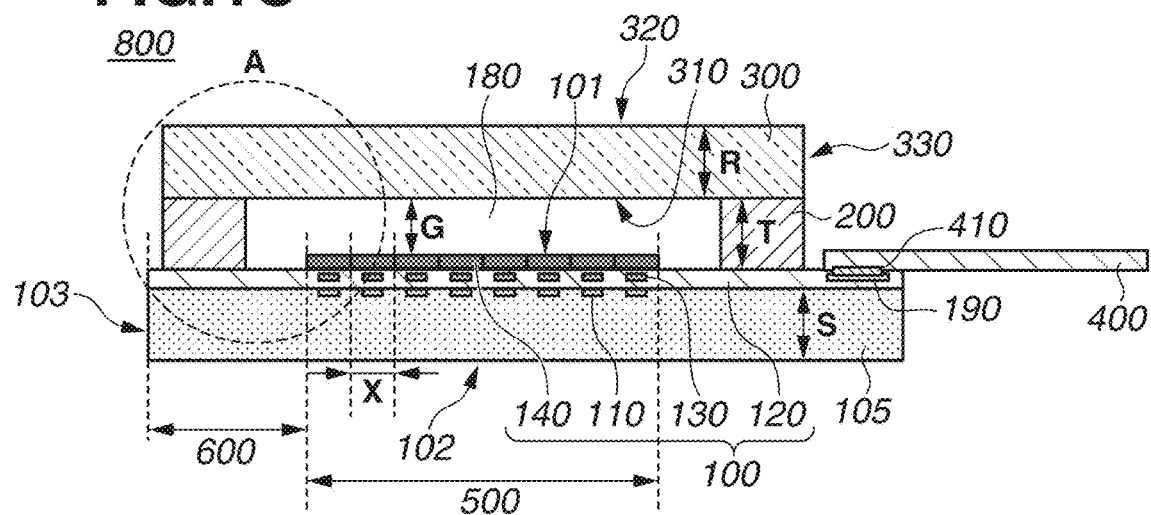

A first exemplary embodiment will now be described. FIG. 1A is a sectional view of a display module 900 including a display apparatus 800. FIG. 1B is a plan view of the display apparatus 800. FIG. 1C is a sectional view of the display apparatus 800. While an exemplary configuration of the display apparatus 800 is described below, the present exemplary embodiment does not need to include all the exemplary configuration of the display apparatus 800. The display apparatus 800 includes a display device 100 including a display region 500 (see FIGS. 1B and 1C), and a light transmission plate 300 overlapping the display device 100. The light transmission plate 300 is opposed to the display region 500 with a void 180 therebetween. In other words, the void 180 is provided between the display region 500 and the light transmission plate 300. The display apparatus 800 includes a bonding member 200 that bonds the light transmission plate 300 to the display device 100. A plurality of pixels 140 is arranged in the display region 500. The pixels 140 each include a display element such as a light emission element, a reflector element, and a shutter element. The display device 100 includes a substrate 105. The substrate 105 may be any of a conductor substrate, an insulator substrate, and a semiconductor substrate. In the present example, the substrate 105 is a monocrystalline silicon semiconductor substrate. At least some of semiconductor elements belonging to the pixels 140 are provided in the substrate 105 or on the substrate 105. The display device 100 includes a peripheral region 600 located around the display region 500. The light transmission plate 300 is opposed to the display region 500 and the peripheral region 600. The bonding member 200 is located between the light transmission plate 300 and the peripheral region 600 of the display device 100. The bonding member 200 is in contact with the light transmission plate 300 and the display device 100.

As illustrated in FIGS. 1A and 1C, the display apparatus 800 is provided with the void 180 between the pixels 140 and the light transmission plate 300. The light transmission plate 300 has a main surface 310, a main surface 320 opposite the main surface 310, and side surfaces 330. The main surface 310 of the light transmission plate 300 is located closer to the display device 100 than the main surface 320 is. Of the two main surfaces 310 and 320 of the light transmission plate 300, the main surface 310 is the surface facing the void 180. The display device 100 has a front surface 101, a back surface 102 opposite the front surface 101, and end surfaces 103. The front surface 101 of the display device 100 is located closer to the light transmission plate 300 than the back surface 102 is. Of the front surface 101 and the back surface 102 of the display device 100, the front surface 101 is the surface facing the void 180. The void 180 is a vacuum space or a space containing a gas. If the space between the display region 500 and the light transmission plate 300 is filled with a light transmission member without the void 180, the light transmission member can absorb light to cause a drop in light use efficiency, thereby deteriorating a display quality such as luminance. The provision of the void 180 can reduce optical loss (optical absorption) between the front surface 101 of the display device 100 and the main surface 310 of the light transmission plate 300, which is advantageous in improving the light use efficiency. The gas in the void 180 is typically air, and the void 180 may also be referred to as an air gap. The gas in the void 180 is not limited to air, and may be an inert gas such as nitrogen and argon, or a reactive gas. The light transmission plate 300 is opposed to the display region 500 and the peripheral region 600. The bonding member 200 is located between the main surface 310 of the light transmission plate 300 and the front surface 101 of the display device 100. The bonding member 200 is in contact with the main surface 310 of the light transmission plate 300 and the front surface 101 of the display device 100. At least some of the display elements included in the pixels 140 in the display region 500 are located between the light transmission plate 300 and the substrate 105.

Now, a distance G from the front surface 101 of the display device 100 facing the void 180 to the main surface 310 of the light transmission plate 300 facing the void 180 will be defined as a dimension corresponding to the thickness of the void 180. Details of the distance G will be described below. In the present example, the light transmission plate 300 is supported by the display device 100 via the bonding member 200. However, the light transmission plate 300 may be supported by other support members that are not in contact with the display device 100, without the bonding member 200 between the light transmission plate 300 and the display device 100. For example, the display device 100 may be fixed to the bottom of a recess in a support member having the recess surrounded by a frame portion, and the light transmission plate 300 may be fixed to the frame portion. In such a manner, the frame portion can form the void 180 between the light transmission plate 300 and the display device 100.

The display device 100 includes an external connection terminal 190. The external connection terminal 190 is provided at a position not overlapping the light transmission plate 300 in a direction in which the display device 100 and the light transmission plate 300 are stacked. As illustrated in FIG. 1B, the light transmission plate 300 has a smaller area than that of the display device 100 when seen in a plan view. While most of the display device 100 including the display region 500 overlaps the light transmission plate 300, the remaining part of the display device 100 does not overlap the light transmission plate 300. The external connection terminal 190 is provided on the part of the display device 100 not overlapping the light transmission plate 300. Alternatively, the external connection terminal 190 can be provided at a position overlapping the light transmission plate 300 if through electrodes are formed in the substrate 105.

The display module 900 includes a wiring member 400, such as a flexible printed circuit, connected to the external connection terminal 190 of the display device 100 of the display apparatus 800. Since the external connection terminal 190 is provided on the part of the display device 100 not overlapping the light transmission plate 300, the light transmission plate 300 does not interfere with the wiring member 400. An electrical connection between the external connection terminal 190 and the wiring member 400, such as a flexible printed circuit, is made by a conductive member 410 such as solder and an anisotropic conductive film (ACF). The display module 900 may further include a light shielding member 450 that is fixed to the display apparatus 800, and a light transmission member 470 that is fixed to the light shielding member 450 so as to cover the light transmission plate 300. There is space 460 between the light transmission member 470 and the light transmission plate 300, surrounded by the light shielding member 450. Since the space 460 is surrounded by the light shielding member 450, the light shielding member 450 may be referred to as a frame member or an outer surrounding member. The light transmission member 470 functions as a cover closing the space 460. The light transmission member 470 may be an optical member such as a lens and a prism. The user can observe an image displayed on the display region 500 of the display device 100 via the light transmission member 470 and the light transmission plate 300.

FIG. 1B illustrates a plan view of the display apparatus 800 as seen perpendicularly to the front surface 101 or the back surface 102 that is a main surface of the display device 100. A layout in a plan view refers to a layout when the display apparatus 800 is seen in a direction perpendicular to the front surface 101 or the back surface 102 that is a main surface of the display device 100 (normal direction of the main surface), and overlapping members are visible therethrough. In the plan view perpendicular to the front surface 101 or the back surface 102 that is a main surface of the display device 100, the light transmission plate 300 overlaps the display region 500 of the display device 100. The direction in which the light transmission plate 300 is opposed to the display device 100 and the pixels 140 (opposed direction) is the direction perpendicular to the front surface 101 or the back surface 102 that is a main surface of the display device 100 (normal direction of the main surface). The display device 100 includes the display region 500 including effective pixels and the peripheral region 600 located around the display region 500. The display region 500 may be referred to as an effective pixel region. The display region 500 is rectangular. For example, the display region 500 has sides of 1 to 100 mm or 5 to 50 mm in length each, with a diagonal length of 1 to 100 mm or 5 to 50 mm. The aspect ratio of the display region 500 is 16:V (V=8 to 13, typically V=9 or 12), for example. The diagonal length of the display region 500 is desirably 24 mm or more. Since an average eyeball size of an adult is 24 mm, a head-mounted display including display regions 500 having a diagonal length of 24 mm or more can provide excellent video experience for the user. The peripheral region 600 can include a peripheral circuit region where one or more peripheral circuits are located. The peripheral circuits of the display apparatus 800 include driving circuits for driving the effective pixels and processing circuits for processing signals to be input to the effective pixels, such as a digital-to-analog conversion circuit (DAC). The peripheral region 600 can include a non-effective pixel region including non-effective pixels and located between the peripheral circuit region and the display region 500. The non-effective pixels refer to pixels not functioning as effective pixels. Examples include dummy pixels, reference pixels, test pixels, and monitoring pixels.

FIG. 1C is a sectional view of the display apparatus 800. The display apparatus 800 includes the external connection terminal 190 formed on the display device 100. The wiring member 400 such as a flexible printed circuit (FPC) is connected to the external connection terminal 190 via the conductive member 410 such as solder and an ACF. The display device 100 includes the substrate 105, semiconductor elements 110, an insulating member 120, wiring structures 130, the pixels 140, and the external connection terminal 190 (also referred to as pads). The light transmission plate 300 is bonded to the display device 100 via the bonding member 200, and the void 180 having a predetermined distance G is provided between the pixels 140 and the light transmission plate 300. The substrate 105 is made of a semiconductor such as monocrystalline silicon. The semiconductor elements 110 are transistors and diodes, at least some of which are located in the substrate 105. The wiring structures 130 each include a multilayer wiring layer including aluminum and copper layers, and via plugs and contact plugs. The external connection terminal 190 can be constituted by wiring layers included in the wiring structures 130.

The insulating member 120 includes a plurality of interlayer insulation layers, such as a silicon oxide layer, a silicon nitride layer, and a silicon carbide layer. Silicon oxynitride and silicon carbonitride consist mainly of nitrogen and silicon, and will thus be regarded as a kind of silicon nitride. The pixels 140 are provided in the display region 500 of the display device 100. Examples of the display elements included in the pixels 140 include electroluminescence (EL) elements in an EL display (ELD), liquid crystal elements (shutter elements) in a liquid crystal display (LCD), and reflector elements in a digital mirror device (DMD).

The display elements in the pixels 140 are connected to the wiring structures 130 through vias (not illustrated) in the insulating member 120, and are electrically connected to the semiconductor elements 110 via the wiring structures 130. A set of red (R), green (G), and blue (B) color pixels 140 typically expresses the color of a display unit 145 in full color. Each color pixel 140 included in a display unit 145 may be referred to as a subpixel. Each pixel 140 includes at least a display element, and is accompanied with a wiring structure 130 and a semiconductor element 110 for driving the display element. Each pixel 140 can include an optical element corresponding to the display element, such as a microlens and a color filter. The size of each pixel 140 will be referred to as a pixel size. In the present exemplary embodiment, the pixel size will be defined as X.

Figure 2A:
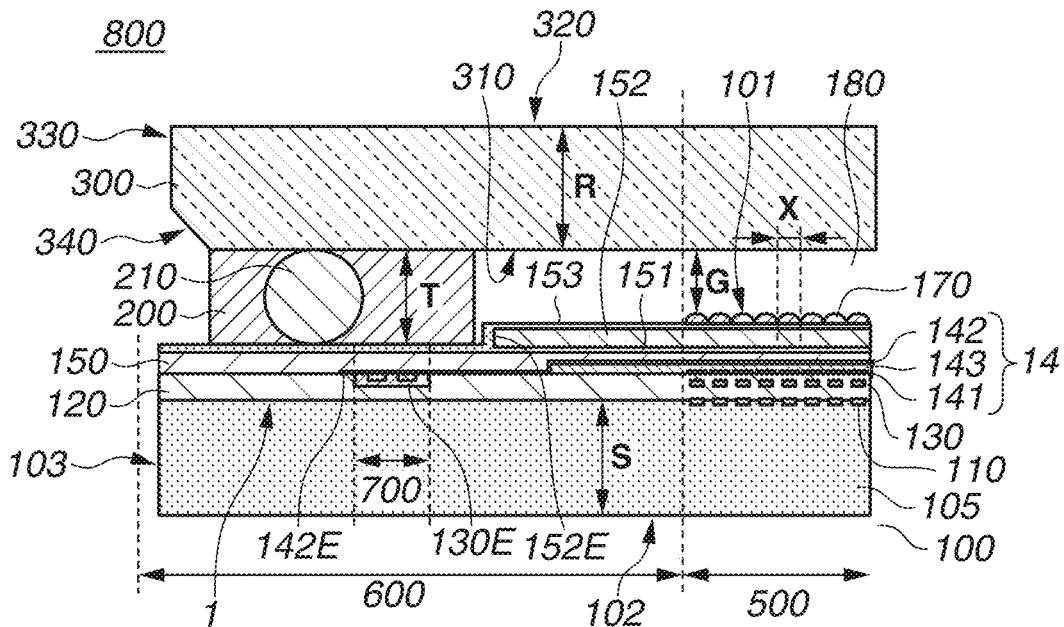
FIGS. 2A and 2B are schematic diagrams illustrating the display apparatus.
Figure 2B:
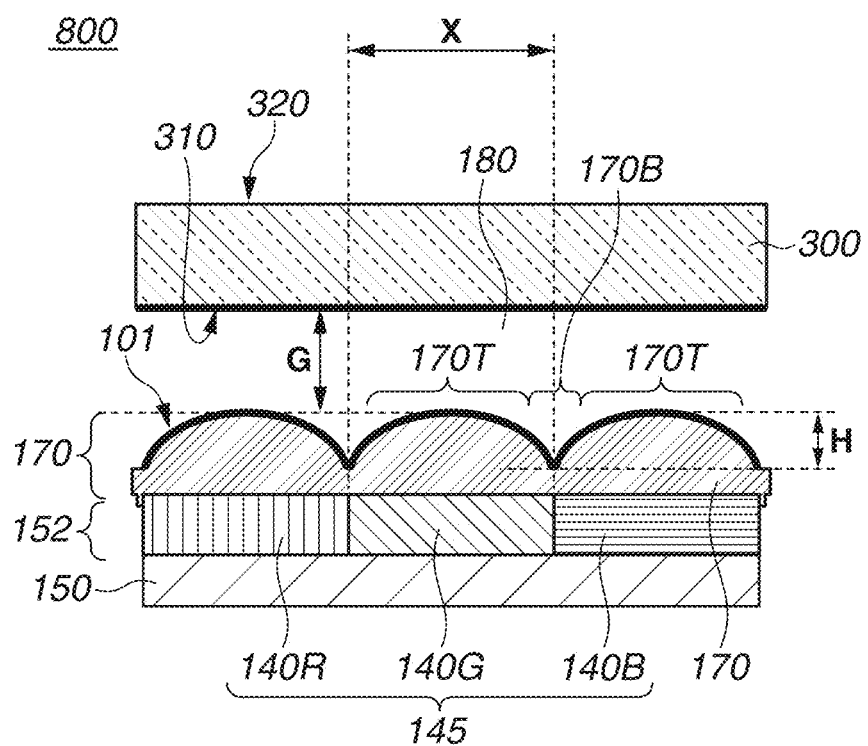

FIG. 2A illustrates an enlarged view of an outer peripheral portion of the display region 500 and the peripheral region 600, surrounded by the broken line A in FIG. 1C. FIG. 2B illustrates an enlarged view of a portion including the display region 500 and the void 180.

The semiconductor elements 110, the insulating member 120, the wiring structures 130, and the pixels 140 are located in/on the main surface of the substrate 105. A protective film 150 is provided over the display elements of the pixels 140. The display elements of the pixels 140 are provided for the respective pixels 140. For example, the display elements are white EL elements. The pixels 140 include the white EL elements, i.e., the display elements, and primary color filters corresponding to the white EL elements. White light emitted from the white EL elements are transmitted through the primary color filters, so that the pixels 140 exhibit primary colors. If the display elements included in the pixels 140 are primary color EL elements, the color filters of the pixels 140 may be omitted, whereas the color filters may be included for improving color purity.

As described above, the size of the pixels 140 is defined as X. For example, the pixels 140 has a size X of 1 to 100 µm, 1 to 50 µm, 2 to 20 µm, 3 to 10 µm, 5 to 10 µm, or 6 to 8 µm. The protective film 150 is provided to prevent intrusion of moisture and oxygen into the pixels 140. The protective film 150 includes an inorganic material layer of silicon nitride, silicon oxynitride, silicon oxide, or aluminum oxide. The inorganic material layer used for the protective film 150 is particularly advantageous in preventing the intrusion of moisture into organic material layers located between the protective film 150 and the substrate 105. The organic material layers located between the protective film 150 and the substrate 105 are included in the display elements, for example. Examples thereof include an organic light-emitting layer. The protective film 150 has a thickness of 1 to 5 µm, 2 to 4 µm, or 3 µm, for example. While in FIG. 2 the protective film 150 is illustrated as a single layer, the protective film 150 may have a multilayer structure including a plurality of inorganic material layers. For example, the protective film 150 may have a structure including two stacked silicon nitride layers, or a structure including an aluminum oxide layer between two silicon nitride layers. In such a case, the aluminum oxide layer may be thinner than the two silicon nitride layers. A color filter array 152 is provided on the protective film 150. Resin layers 151 and 153 are provided under and on the color filter array 152, respectively, as appropriate. The resin layer 151 is formed to flatten the uneven surface of the protective film 150. The resin layer 151 may be made of a transparent resin such as acrylic resin and epoxy resin. For example, the resin layer 151 has a thickness of 100 to 1000 nm. The thickness of the resin layer 151 is 500 nm, for example. At least one resin layer is provided on the protective film 150. Examples of the resin layer on the protective film 150 include the resin layer 151, the color filter array 152, the resin layer 153, and a lens array 170. The resin layer 153 on the protective film 150 is provided between the color filter array 152 and the void 180. The resin layer 151 on the protective film 150 is provided between the color filter array 152 and the inorganic material layer included in the protective film 150.

Details of the color filter array 152 will be described. The color filter array 152 in the display region 500 includes a plurality of colors of primary color filters arranged in an array. The primary colors of the color filter array 152 are R, G, and B, whereas cyan (C), magenta (M) and yellow (Y) color filers may be used instead. The color filters may be in a stripe arrangement, a delta arrangement, or a Bayer arrangement. The color filter array 152 in the peripheral region 600 includes a multicolor portion where color filters of a plurality of colors are arranged in an array. The multicolor portion may include an array of color filters in the same arrangement as in the display region 500, or an array of color filters having different pixel sizes color by color. Alternatively, the color filter array 152 in the peripheral region 600 may include a single-color portion where a color filter of one color is extended. Here, the color filter of the one color in the single-color portion has a width greater than that of the color filters of the respective colors in the display region 500 (i.e., the width of a pixel). The width of the color filter of the single color in the single-color portion is also greater than that of the color filters of the respective colors in the multicolor portion. For example, the single-color portion has a width of 10 µm or more, or 100 µm or more, and 1000 µm or less. The multicolor portion may be provided outside the display region 500, and the single-color portion may further be provided outside the multicolor portion. The multicolor portion and the single-color portion may be arranged irrespective of the circuit configuration of the peripheral region 600. The color of the single-color portion can be one of the plurality of colors of the color filters included in the color filter array 152 that readily absorbs light of longer wavelengths in the visible light. Of R, G, B, C, M, and Y filters, a B filter is desirably used for the single-color portion. The reason is that a B filter readily absorbs G light and R light. The color filter array 152 has a thickness of 0.5 to 5 µm, 1 to 3 or 1.5 to 2.5 for example.

The resin layer 153 can stabilize the shape of the lens array 170 to be formed by flattening the surface of the color filter array 152. The resin layer 153 has a thickness of 100 to 1000 nm, e.g., 500 nm. The lens array 170 may be provided on the resin layer 153. The lens array 170 is provided at least in the display region 500, and may be provided in the peripheral region 600 as well. The lens array 170 is provided to collect light emitted from the display elements of the pixels 140 to improve extraction efficiency, and may be made of a transparent resin such as acrylic resin and styrene resin. The lens array 170 may be made of an inorganic material such as silicon oxide and silicon nitride if transparent. The lens array 170 typically is a fly array where microlenses having spherical, substantially spherical, or non-spherical surfaces are two-dimensionally arranged in rows and columns. However, the lens array 170 may be a vertical or horizontal, one-dimensional array of cylindrical lenses. In the fly array, the number of discrete vertexes of the microlenses can be the same as the number of pixels 140 or the number of display units 145. In the present example, a microlens in the lens array 170 corresponds to a pixel 140. However, a microlens in the lens array 170 may correspond to a display unit 145. For example, one microlens in the lens array 170 may correspond to a plurality of pixels, e.g., three pixels 140R, 140G, and 140B, included in a display unit 145. The number C of vertexes of the microlenses of the lens array 170 in the display region 500 is greater than or equal to the number N of display units 145 provided in the display region 500 (C≥N). Typically, C=N×S is satisfied, where S is the number of pixels 140 included in a display unit 145. If S≥2, C≥2×N is satisfied. If S=3 as in this example, then C=3×N is satisfied. If the display region 500 including three-color subpixels has a full high definition (HD) standard resolution (1920×1080), the number N is equal to 2073600 (N=2073600) and the number C is equal to 6220800 (C=6220800). A display region 500 having higher resolution than the full HD standard resolution may be also used. In such a case, the lens array 170 has more than 6220800 vertexes.

The lens array 170 has a height of 0.5 to 5 µm, 1 to 3 or 1.5 to 2.5 for example. The transparent material forming the lens array 170 has a refractive index of approximately 1.4 to 2.0, for example. The refractive index of the void 180 is 1.0. The difference between the refractive indices of the void 180 and the lens array 170 can thus increase the lens power of the lens array 170, as compared to the case where the space between the display region 500 and the light transmission plate 300 is filled with a solid light transmission member having a refractive index of approximately 1.1 to 1.5. This can improve the light use efficiency and also improve the display quality. The display device 100 is configured in the manner described above, and the bonding member 200 is provided in the peripheral region 600 of the display device 100 and the light transmission plate 300 is bonded thereto. The bonding member 200 typically includes a resin portion mainly made of a resin, whereas the bonding member 200 may include an inorganic material such as glass frit and a metal braze. Spacers 210 are desirably included in the resin portion of the bonding member 200. The thickness (distance G) of the void 180 between the lens array 170 constituting the front surface 101 of the display device 100 and the light transmission plate 300 can be controlled based on the thickness T of the bonding member 200. Since the spacers 210 are included in the bonding member 200, the thickness of the void 180 can be determined based on the size of the spacers 210 included in the bonding member 200. As described above, the thickness of the void 180 is defined as the distance G. If the front surface 101 of the display device 100 is uneven due to the presence of the lens array 170 in the display device 100 as in the present exemplary embodiment, the distance G refers to the distance from the vertexes of the bumps on the front surface 101 to the light transmission plate 300. The distance G may refer to the distance between the highest portion of the front surface 101 of the display device 100 and the light transmission plate 300, or the shortest distance between the front surface 101 of the display device 100 and the light transmission plate 300. Resin beads or silica beads can be used as the spacers 210. The spacers 210 are desirably spherical since the dimension thereof can be defined regardless of orientation. For example, the spherical spacers 210 have a diameter of 10 to 50 µm, 20 to 40 µm, or 30 µm. The distance G can be determined by the thicknesses of the layers (the color filter array 152 and the lens array 170) located between the layer in contact with the spacers 210 (the inorganic material layer of the protective film 150 or the resin layers 151 and 153) and the light transmission plate 300. If the total thickness of the layers located between the layer in contact with the spacers 210 and the light transmission plate 300 is 5 µm or less and the spacers 210 each having a diameter of 30 µm are used, the distance G can be 25 to 30 µm, for example.

While the light transmission plate 300 can be made of any light transparent material such as glass and acryl resin, alkali-free glass is suitably used. The thickness R of the light transmission plate 300 is not limited in particular, but suitably 0.1 to 1 mm, 0.3 to 0.7 mm, or 0.5 mm, for example. The thickness S of the substrate 105 is not limited in particular, but suitably 0.3 to 0.8 mm, for example. The thickness S of the substrate 105 is desirably greater than the thickness R of the light transmission plate 300 (i.e., S>R). The reason is that the thick substrate 105 can prevent damage to the display device 100. If the thickness S of the substrate 105 is less than 300 µm, the substrate 105 can warp toward the void 180. The corners adjoining the main surface 310 of the light transmission plate 300 opposed to the display device 100 and the side surfaces 330 may have slopes 340 extending from the side surfaces 330 to the main surface 310 of the light transmission plate 300. The slopes 340 are oblique to the side surfaces 330 and the main surface 310. The slopes 340 can be formed by chamfering the base of the light transmission plate 300. The provision of the slopes 340 can prevent from the corners of the light transmission plate 300 from making contact with the display device 100 and damaging the display device 100 when the light transmission plate 300 is bonded to the display device 100. In this respect, the width of the slopes 340 in a direction parallel to the main surface 310 of the light transmission plate 300 may be greater than the width (depth) of the slopes 340 in a direction normal to the main surface 310 of the light transmission plate 300. In other words, the angles (obtuse angles) formed between the slopes 340 and the main surface 310 may be greater than the angles (obtuse angles) formed between the slopes 340 and the side surfaces 330. The width of the slopes 340 in the direction parallel to the main surface 310 of the light transmission plate 300 is 50 to 250 µm, or 200 µm, for example. The width (depth) of the slopes 340 in the direction normal to the main surface 310 of the light transmission plate 300 is 50 to 250 µm, or 150 µm, for example. At least either one of the two main surfaces 310 and 320 of the light transmission plate 300 is desirably formed by an anti-reflection (AR) film formed on the base of the light transmission plate 300. The formation of the AR film can prevent a ghost (phenomenon where a plurality of contours appears in an image) from occurring because display light is reflected at the interface of the light transmission plate 300 and reflected again at the display device 100. The main surface 310 of the light transmission plate 300 is defined as a surface facing the void 180. If the base of the light transmission plate 300 faces the void 180, the surface of the base constitutes the main surface 310. If a functional film, such as an AR film, formed on the base of the light transmission plate 300 faces the void 180, the functional film constitutes the main surface 310 of the light transmission plate 300. Examples of functional films other than the AR film include an antistatic film, an antifogging film, and a moisture absorption film.

An organic EL display apparatus that is an example of the exemplary embodiment will be described with reference to FIGS. 2A and 2B. As illustrated in FIGS. 2A and 2B, the organic EL display apparatus according to the present exemplary embodiment includes the substrate 105. For example, a monocrystalline semiconductor substrate made of silicon can be used as the substrate 105. The semiconductor elements 110 such as transistors are provided in/on a main surface 1 that is the front surface of the substrate 105. The substrate 105 may be an insulator substrate such as a glass substrate and a resin substrate. Thin-film transistors (TFT) serving as the semiconductor elements 110 may be arranged on the insulator substrate. The insulating member 120 is provided on the semiconductor elements 110 and the main surface 1 of the substrate 105. The insulating member 120 is made of silicon oxide or silicon nitride. Contact plugs (not illustrated) electrically connected to the semiconductor elements 110 are arranged in the insulating member 120. Conductive members made of tungsten are embedded in the contact plugs. The wiring structures 130 electrically connected to the semiconductor elements 110 via the contact plugs is located inside the insulating member 120. The wiring structures 130 may include metal members such as aluminum and copper members. To prevent metal diffusion into the insulating member 120, a barrier metal such as Ti, Ta, TiN, and TaN may be provided at the interface between the insulating member 120 and the wiring structures 130. In the peripheral region 600 of the substrate 105, the external connection terminal 190 and ground wiring 130E are provided in the same layer as the wiring structures 130 are. As illustrated in FIG. 1C, the insulating member 120 has an opening above the external connection terminal 190, whereby the external connection terminal 190 is exposed from the opening of the insulating member 120. Similarly, the insulating member 120 has an opening above the ground wiring 130E, whereby the ground wiring 130E is exposed from the opening of the insulating member 120. The ground wiring 130E is connected to a counter electrode of the display elements in a subsequent step.

Organic EL elements serving as display elements 14 included in the pixels 140 are provided on the insulating member 120 in the display region 500. The display elements 14 can each include a pixel electrode 141 electrically connected to a wiring structure 130 through a via plug, a counter electrode 142, and an organic material layer 143 provided between the pixel electrode 141 and the counter electrode 142. The pixel electrodes 141 are isolated by pixel isolation portions (not illustrated), such as banks pixel, by pixel, and function as either an anode or a cathode (in this example, anode) of the respective organic EL elements (display elements 14). The counter electrode 142 functions as the other of the anode and cathode (in this example, cathode) of the organic EL elements. The pixel electrodes 141 desirably has a structure such that the ends of the pixel electrodes 141 are covered with the pixel isolation regions (banks) made of an insulating layer to prevent a short circuit between the pixel electrodes 141 and the counter electrode 142. To facilitate injection and transport of holes from the pixel electrodes 141, a hole injection layer and a hole transport layer are desirably formed between the organic light emitting layer and the pixel electrodes 141. To facilitate injection and transport of electrons from the counter electrode 142, an electron transport layer and an electron injection layer are desirably formed between the organic light emitting layer and the counter electrode 142. Here, each display element 14 has a layered structure including the pixel electrode 141, the hole injection layer, the hole transport layer, the organic light emitting layer, the electron transport layer, the electron injection layer, and the counter electrode 142. The hole injection layer, the hole transport layer, the organic light emitting layer, the electron transport layer, and the electron injection layer are an organic material layer each. The organic materials constituting the organic material layers are typically low molecular organic materials but may be polymeric organic materials. Typical resins are polymeric organic materials. Silicone resins contain an inorganic skeleton and an organic group in the side chains and are hybrid materials having both inorganic and organic properties. Silicon resins can thus be classified both as organic materials and inorganic materials. The counter electrode 142 is common to all the pixels 140. The counter electrode 142 is extended up to the peripheral region 600 and connected to the foregoing ground wiring 130E. The counter electrode 142 is a conductor film provided on the display region 500 and the peripheral region 600. The counter electrode 142 can be a conductor film made of a metal material such as silver (Ag), an alloy material such as a silver (Ag)-magnesium (Mg) alloy (AgMg), or a transparent conductive material such as indium tin oxide (ITO). For mutual connection, the ground wiring 130E of each wiring structure 130 and the counter electrode 142 both include a contact portion 700 called cathode contact. The organic material layer 143 and the counter electrode 142 are formed over the entire surface of the display region 500 by vapor deposition or sputtering using a metal mask. Since there is some void between the metal mask and the substrate 105, the materials can spread to the outer side of the metal mask opening. Since the organic material layer 143 spreads out by 0.2 mm or more, the contact portion 700 is desirably provided at least 0.2 mm or more outside the edge of the display region 500. The contact portion 700 has a width of 50 μm or more and 500 μm or less, or 100 to 200 μm, for example.

The protective film 150 for sealing is then formed over the organic EL elements (display elements 14) to prevent moisture infiltration. The protective film 150 is provided to protect the display elements 14, and may also be referred to as a passivation film or a sealing film. An additional lens structure may be provided on the protective film 150 for improving light extraction efficiency. Before the formation of the color filter array 152 to be described below, the resin layer 151 for flattening can be formed to reduce pixel-to-pixel differences in height between the organic EL elements. The color filter array 152 is then formed at least over the display elements 14 (organic EL elements) in the display region 500. The color filter array 152 includes an effective pixel portion including color filters of three colors, i.e., R, G and B colors. The color filters are arranged in a delta arrangement, for example. The peripheral region 600 mainly including one or more peripheral circuits is located outside the display region 500. The color filter array 152 is also provided on the insulating member 120 in the peripheral region 600. The color filter array 152 in the peripheral region 600 may have an RGB three-color parallel arrangement as in the display region 500, or a three-color layered structure for improved light shielding property. A color filter of one of the colors may be singly arranged. In the case of the single-color arrangement, the color filter array 152 in the peripheral region 600 is desirably blue since the blue filter provides the least visibility for application where the background outside the display region 500 is a dark portion, like an organic EL display apparatus. Unlike the arrangement of the color filter array 152 in the display region 500, the color filter array 152 in the peripheral region 600 does not need to be in a delta arrangement and may be arranged in any pattern. A positional relationship between the color filter array 152 and the bonding member 200 to be formed in a subsequent step will be described below. Since the vicinity of the foregoing contact portion 700 is uneven, the color filter array 152 is desirably provided inside the contact portion 700 and not on the contact portion 700. An outer edge 142E of the counter electrode 142 is therefore desirably located outside an outer edge 152E of the color filter array 152. As a result, the outer edge 152E of the color filter array 152 overlaps the counter electrode 142. In the present example, the conductive film constituting the counter electrode 142 overlaps the bonding member 200. For the purpose of surface protection and planarization of the color filter array 152, the transparent resin layer 153 is formed over the color filter array 152. The lens array 170 is provided on the resin layer 153. The lens array 170 includes a plurality of microlenses provided for the respective pixels 140, and can be formed by exposure and development processes. Specifically, a film (photoresist film) made of the material for forming the microlenses is formed, and the photoresist film is exposed and developed by using a mask having continuous gradations. Examples of such a mask may include a gray tone mask and an area gradation mask. The area gradation mask is a light shielding film having dots with a resolution higher than that of the exposure system, and the dot density distribution is changed to enable light irradiation on the image forming plane with continuous gradations. The microlenses formed by the exposure and development processes can be etched back to adjust the lens shape. In the present example, a photosensitive transparent acrylic resin is used as the material of the lens array 170. The lens array 170 may be located not only in the display region 500 but at any position in the peripheral region 600 as well. The shape of the lens array 170 in the peripheral region 600 may be different from that of the lens array 170 in the display region 500.

Next, the resin material for forming the bonding member 200 is applied to the peripheral region 600 of the substrate 105 except the region of the external connection terminal 190 by a technique such as dispensing and screen printing. After the light transmission plate 300 is attached to the substrate 105, the resin material is cured to form the bonding member 200. As illustrated in FIGS. 2A and 2B, the distance G between the outermost surface of the display device 100, i.e., the lens array 170, and the light transmission plate 300 is determined by the thickness T of the cured bonding member 200. The bonding member 200 can be made of any one of epoxy, acrylic, urethane, and polyimide resins, such as an ultraviolet (UV) curing resin, a thermosetting resin, and a two-component mixed resin, and spacers 210 are desirably contained in the resin as appropriate. It is desirable to contain spacers 210 because the thickness T of the bonding member 200 in bonding the substrate 105 and the light transmission plate 300 can be easily controlled by the size of the spacer 210 and thereby the distance G between the lens array 170 and the light transmission plate 300 can be precisely controlled. While any spacers such as glass beads and resin beads can be used as the spacers 210, resin beads are desirably used since resin beads are less likely to damage the insulating member 120 and the protective film 150 on the substrate 105. If the color filter array 152 is not provided under the entire area where the bonding member 200 is formed, the thickness T of the bonding member 200 can be set to be greater than the total thickness of the color filter array 152 and the lens array 170. This can produce the void 180 defining the distance G between the lens array 170 and the light transmission plate 300. Although the distance G and the thickness T may be the same, the distance G is typically less than the thickness T (G<T). For example, if the color filter array 152 has a thickness of 1.5 µm and the lens array 170 has a thickness of 2 µm, the thickness T of the bonding member 200 is desirably 3.5 µm or more. A thickness T of 50 µm or less is sufficient for the bonding member 200. The distance G can thus be less than 50 µm. In the present example, the light transmission plate 300 is made of alkali-free glass. For example, the light transmission plate 300 has a thickness of 0.1 to 1 mm, 0.3 to 0.7 mm, or 0.5 mm. The slopes 340 are formed at the corners between the main surface 310 of the light transmission plate 300 opposed to the display device 100 and the side surfaces 330 by chamfering.

Wafer-level packaging may be employed. For example, the substrate 105 is prepared as a silicon wafer. A plurality of display devices is formed on the silicon wafer, and color filter arrays 152 are formed on the respective display devices. A bonding member 200 is then formed on the silicon wafer to surround the respective display devices. A glass wafer serving as the light transmission plate 300 is prepared, and the glass wafer is bonded to the silicon wafer via the bonding member 200. The bonded body of the silicon wafer and the glass wafer is diced for respective devices. The portion of the glass wafer above the external connection terminal 190 can be removed after the dicing.

The external connection terminal 190 and an external power supply (not illustrated) are then connected to each other by using mounting means (not illustrated) such as bonding wires, bumps, and an anisotropic conductive resin, whereby the organic EL display apparatus according to the present exemplary embodiment is completed. Moreover, the light shielding member 450 to which the light transmission member 470 is attached in advance is brought into contact with the light transmission plate 300 of the display apparatus 800 and fixed by an adhesive (not illustrated) applied at arbitrary positions, whereby the display module 900 is completed.

Figure 3A:
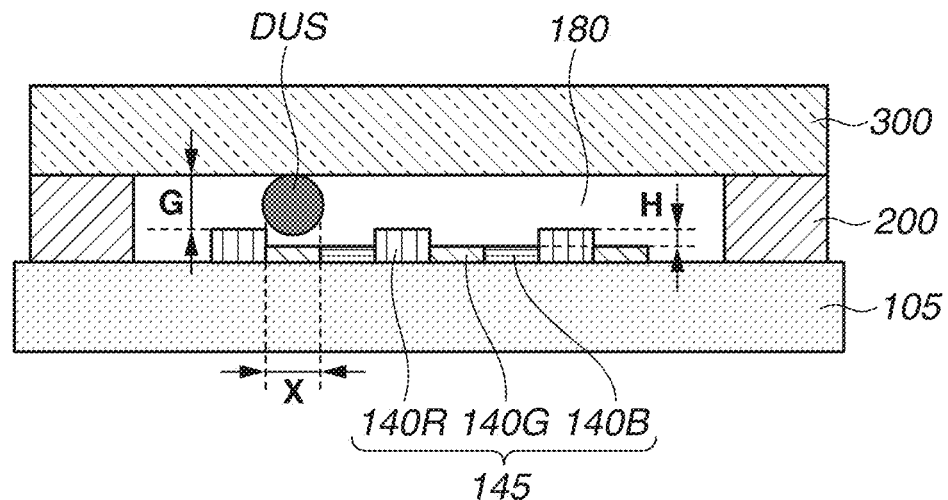
FIGS. 3A and 3B are schematic diagrams illustrating the display apparatus.

The distance G in the display region 500 will be described with reference to FIG. 2B. In the display region 500, the front surface 101 of the display device 100 has a height difference H. For example, the height difference H is 0.5 to 5 µm, 1 to 3 µm, or 1.5 to 2.5 Relatively high portions of the front surface 101 will be referred to as high portions 170T, and relatively low portions will be referred to as low portions 170B. For the sake of convenience, the border between the high portions 170T and the low portions 170B may be set at the position corresponding to one half of the height difference H. In FIG. 2B, the height difference H can be formed by the bumps and dips due to the shape of the lens array 170. Alternatively, as illustrated in FIG. 3A, the height difference H can be formed by bumps and dips due to the color filters in the color filter array 152. The shapes of both the lens array 170 and the color filter array 152 may be reflected on the height difference H. The shapes of other components such as the protective film 150 may be reflected on the height difference H.

The display quality of the display apparatus 800 can be lowered by foreign substances since the user of the display apparatus 800 optically observes the display region 500. A drop in the optical display quality due to foreign substances is difficult to correct by electrical techniques such as signal processing. Measures against foreign substances are therefore important to the display apparatus 800. The height difference H to be taken into account in taking measures against foreign substances is greater than 1 µm. A height difference H of 1 µm or less is regarded as substantially flat, and a discussion thereof will be omitted here. In particular, foreign substances smaller than the wavelengths of the visible light used in the display apparatus 800 (400 to 800 nm, typically 550 nm) are considered to have not much effect on the display quality to the user. With a height difference H of 100 nm or less, the front surface 101 may be regarded as substantially flat. The portion of the main surface 310 of the light transmission plate 300 opposed to the display region 500 desirably has a height difference smaller than the height difference H of the front surface 101 of the display device 100 in the display region 500. For example, the portion of the main surface 310 of the light transmission plate 300 opposed to the display region 500 has a height difference of 1 µm or less, 500 nm or less, or 100 nm. One of the characteristics of the present exemplary embodiment is that, the distance G between the display region 500 and the light transmission plate 300 is greater than the height difference H.

The relationship of the distance G with a foreign substance DUS included between the display region 500 and the light transmission plate 300 will be examined. Suppose that the foreign substance DUS has a size Q not exceeding the height difference H (Q≤H). In such a case, the effect of the foreign substance DUS is small since the foreign substance DUS lies between a low portion 170B of the front surface 101 and the light transmission plate 300 even if the front surface 101 is in contact with the main surface 310 (G=0). However, a foreign substance DUS having the size Q less than or equal to the height difference H (Q≤H) can sometimes adhere to a high portion 170T. In such a case, if the distance G is less than or equal to the size Q of the foreign substance DUS (G≤Q), the foreign substance DUS can come into contact with and be fixed to both the front surface 101 and the main surface 310. Moreover, the foreign substance DUS can be pressed against the display device 100 by the light transmission plate 300. The fixing of the foreign substance DUS can cause a drop in image quality. The pressing of the foreign substance DUS can damage the display device 100. To reduce such issues, the distance G can be made greater than the size Q of the foreign substance DUS (G>Q). Considering Q≤H, the distance G can be set to satisfy Q≤H<G. This shows that setting the distance G to be greater than the height difference H is advantageous in preventing a drop in the reliability and display quality of the display apparatus 800 with the presence of the foreign substance DUS having a size Q smaller than the height difference H. As measures against the foreign substance DUS having a size Q smaller than the height difference H, the distance G may be 10 µm or less.

The relationship between the pixel size X and the distance G according to the present exemplary embodiment will be described in detail with reference to FIG. 2B. One of the characteristics of the present exemplary embodiment is that, in the region between the display region 500 and the light transmission plate 300, the distance G is greater than the pixel size X (G>X). In FIG. 3A, the semiconductor elements 110 and the wiring structures 130 of the display device 100 are omitted to illustrate only the pixels 140. The display elements 14 are provided for the respective pixels 140. In the present example, a display unit 145 includes an R pixel 140R, a G pixel 140G, and a B pixel 140B.

Figure 4A:
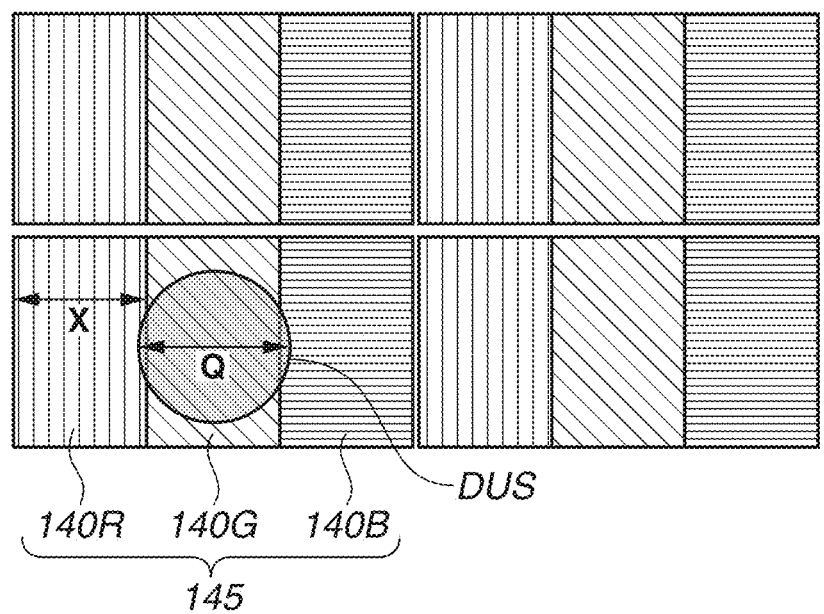
FIGS. 4A and 4B are schematic diagrams illustrating the display apparatus.
Figure 4B:
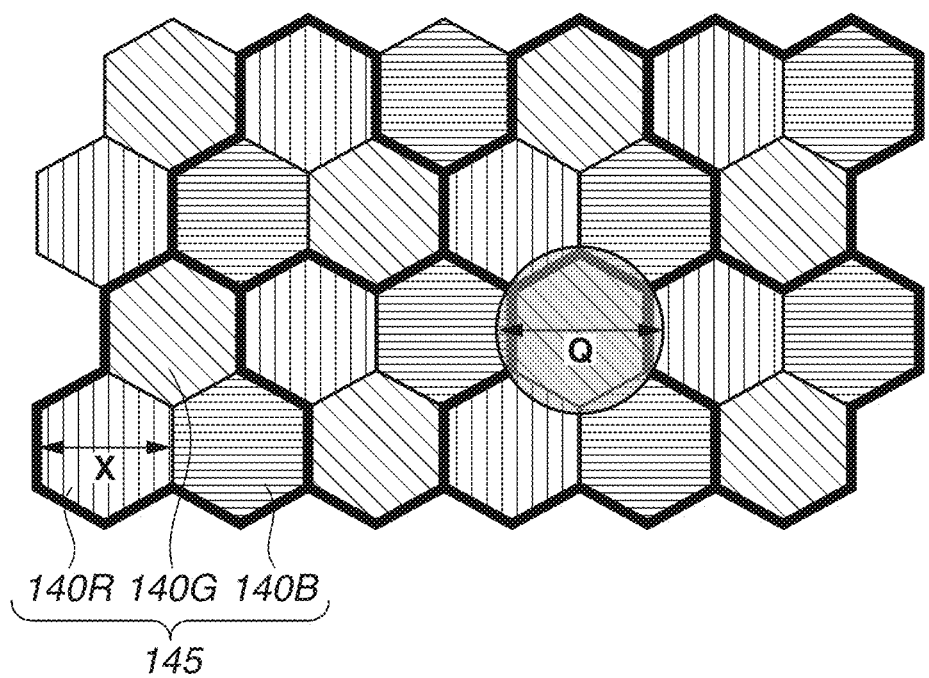

FIGS. 4A and 4B illustrate planar layouts of the pixels 140 when the display units 145 are seen in the normal direction of the front surface 101 that is a main surface of the display device 100. FIG. 4A illustrates a stripe arrangement, and FIG. 4B a delta arrangement. In FIG. 4B, the pixels 140 included in each display unit 145 are surrounded by a thick line. The length of a pixel 140 in a direction in which pixels 140 of all the colors are periodically arranged is desirably employed as the pixel size X. If the outline of a pixel 140 has a polygonal planar shape, the pixel size X can be defined by the distance between opposite sides of the polygonal shape. If the distance between opposite sides varies from one pair of opposite sides to another, the shortest distance can be employed as the pixel size X. In the example of FIG. 4A, the pixels 140 have a rectangular outline, and the pixel size X is defined by the distance between the long sides of the rectangular shape, i.e., the length of the short sides. The reason is that, in the example of FIG. 4A, the pixels 140R, 140G, and 140B are periodically arranged in the direction in which the long sides of the rectangular shapes adjoin to each other (horizontal direction in the diagram). In the example of FIG. 4B, the pixels 140 have a polygonal outline, and the pixel size X is defined by the distance between the opposite sides of the polygonal shape. The reason is that, in the example of FIG. 4B, the pixels 140R, 140G, and 140B are periodically arranged in directions in which the opposite sides of the rectangular shapes adjoin (horizontal direction in the diagram).

The case where there is a foreign substance DUS between the display device 100 and the light transmission plate 300, i.e., in the void 180, will be described with reference to FIGS. 3A, 3B, 4A, and 4B. The foreign substance DUS may have been originally adhered to the display device 100 or the light transmission plate 300 or may have been included therebetween when the light transmission plate 300 is bonded to the display device 100. The presence of small foreign substances not exceeding the pixel size X can only be suppressed to a limited extent. A description will be given of a structure of the display device 100 to maintain the display quality if there are foreign substances smaller than or equal to the pixel size X. As illustrated in FIG. 3A, assume a model in which a foreign substance DUS of size Q has the shape of a sphere with a diameter of Q. The size Q of the foreign substance DUS is less than or equal to the pixel size X, i.e., Q≤X. If the distance G is less than or equal to the size Q of the foreign substance DUS (G≤Q), the foreign substance DUS can be pressed into a pixel 140 to damage the pixel 140 and cause the pixel 140 to be non-luminescent when the light transmission plate 300 is bonded to the display device 100. Moreover, the foreign substance DUS sandwiched and fixed between the light transmission plate 300 and the display device 100 can block the light from the pixel 140 or change the optical path of the light. In other words, if the distance G is less than the pixel size X, the display quality can be impaired by the foreign substance DUS. By contrast, if the distance G is greater than the size Q of the foreign substance DUS (G>Q) as in the present exemplary embodiment, the foreign substance DUS can be prevented from being pressed into a pixel 140. A drop in the display quality due to the foreign substance DUS can thus be prevented by satisfying Q≤X<G to satisfy Q≤X and Q<G, or equivalently, making the distance G greater than the pixel size X (X<G). Thus designing the distance G to be greater than the pixel size X (G>X) can improve the display quality.

Figure 5:
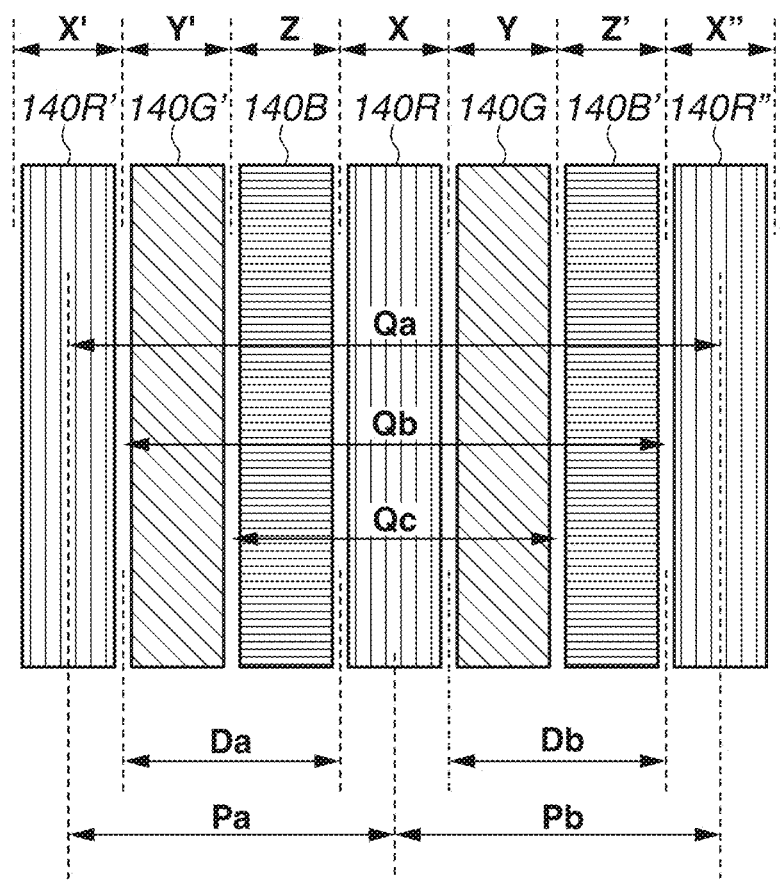
FIG. 5 is a schematic diagram illustrating the display apparatus.

If there is a foreign substance DUS greater than the pixel size X on a pixel 140, the foreign substance DUS blocks the emitted light, and can cause a pixel defect depending on the standard of the display device 100. A desirable range of the distance G will be described with reference to FIG. 5. In FIG. 5, the pixel size of a pixel of a first color (for example, R), 140R, will be defined as X. The pixel size of a pixel of a second color different from the first color (for example, G), 140G, will be defined as Y. The pixel size of a pixel of a third color different from the first and second colors (for example, B), 140B, will be defined as Z. In FIG. 5, pixels of the same color are given the same hatching pattern. The hatching patterns of the respective colors in FIG. 5 are the same as those in FIGS. 4A and 4B. The pixels 140R, 140G, and 140B in FIG. 5 correspond to the pixels 140R, 140G, and 140B horizontally arranged in FIGS. 4A and 4B. The pixel sizes X, Y, and Z may be different (X<Y<Z, X>Y>Z, or Y<X<Z) or the same (X=Y=Z). The pixel size of a pixel of the same color (for example, R) as the pixel 140R of the first color, 140R', will be defined as X'. The pixel size of another pixel of the same color (for example, R) as the pixel 140R of the first color, 140R", will be defined as X". The pixel sizes X, X', and X" may be different (X<X'<X", X>X'>X", or X'<X<X") or the same (X=X'=X"). The pixel size of a pixel of the same color (for example, G) as the pixel 140G of the second color, 140G', will be defined as Y'. The pixel size of a pixel of the same color (for example, B) as the pixel 140B of the third color, 140 W, will be defined as Z'. The pixel sizes Y and Y' may be different (Y<Y' or Y>Y') or the same (Y=Y'). The pixel sizes Z and Z' may be different (Z<Z' or Z>Z') or the same (Z=Z').

Now, focus attention on the pixel 140R having the pixel size X. The pixels 140R' and 140R" of the same color are located on both sides of the pixel 140R of interest. Pixels of the other colors are arranged between the pixel 140R and the pixels 140R' and 140R" of the same color on both sides. If each display unit 145 has an RGB three-color configuration and the pixel 140R of interest is R as illustrated in FIG. 5, then G and B pixels are arranged between the pixel 140R and the pixels 140R' and 140R" of the same color on both sides. The distance from the pixel 140R to the pixel 140R' will be defined as Da, and the distance from the pixel 140R to the pixel 140R" as Db. Typically, they are given by the equations, Da=Y'+Z and Db=Y+Z'. The pitch between the pixels 140R and 140R' will be defined as Pa, and the pitch between the pixels 140R and 140R" as Pb. The pitch between two pixels refers to the distance between the respective centers of the two pixels. They are given by the equations, Pa=X/2+Da+X'/2 and Pb=X/2+Db+X"/2. Typically, they are given by the equations, Pa=X+Da and Pb=X+Db.

In the description of the case where G>X, the effect of the foreign substance DUS having a size Q smaller than the pixel size X on the display quality has been examined. In the following description, a foreign substance DUS having a size Q greater than the pixel size X will be examined. As the foreign substance DUS has a larger size, a display defect caused by the foreign substance DUS sandwiched and fixed between the light transmission plate 300 and the display device 100 or a display defect caused by the foreign substance DUS pressed against the display device 100 affects a wider range of pixels. Such display defects caused by the fixing and pressing of the foreign substance DUS are desirably confined within the range of three pixels, including the pixel of interest and the pixels on both sides thereof. In FIG. 5, the range represented by a size Qc corresponds to the size Q of the foreign substance DUS to be examined by this index. One first-color (for example, R) pixel 140R is located between one second-color (for example, G) pixel 140G and one third-color (for example, B) pixel 140B. The equation, size Q=Qc=X+Y+Z, can satisfy G>Q. In other words, the distance G is desirably greater than the sum of the pixel size X of the pixel 140R, the pixel size Y of the pixel 140G, and the pixel size Z of the pixel 140B (G>X+Y+Z). Applying X=Y=Z to G>X+Y+Z yields G>3×X. The distance G only need to be 18 μm or more if the pixel size X is 6 μm or more.

Next, a foreign substance DUS entering the void 180 between the display region 500 and the light transmission plate 300 will be examined. Suppose that the pattern of the bonding member 200 has an opening (gap 250) where the bonding member 200 is absent as will be described below. In such a case, the greater the distance G, the more likely a foreign substance DUS is to enter. In addition, the greater the distance G, the more likely a ghost, i.e., a phenomenon in which a plurality of image contours is visible, caused by part of display light that is reflected at the light transmission plate 300 and reflected again at the display device 100, is to occur. For such reasons, an appropriate upper limit is desirably set for the distance G. As the quality standard of the display apparatus 800 varies depending on the product specifications, indices are to prevent a display defect across a plurality of adjoining pixels of the same color or different colors.

A first index is to prevent a display defect across a pixel of interest and pixels of the same color on both sides thereof. If a foreign substance DUS lies across a total of three pixels of the same color (for example, R), including the pixels 140R, 140R', and 140R", a display defect is regarded as likely to occur. In FIG. 5, the three pixels of the same color are illustrated as follows. The first-color (for example, R) pixel 140R is located between the two first-color (for example, R) pixels 140R' and 140R" in the direction in which the pixel 140R has the pixel size X. In FIG. 5, the range represented by a size Qa corresponds to the size Q of the foreign substance DUS to be examined by the first index. Two second-color (for example, G) pixels 140G and 140G' and two third-color (for example, B) pixels 140B and 1403 are located between the two first-color pixels 140R' and 140R". The case where a foreign substance DUS having a size Q lies across three pixels of the same color (for example, R) refers to a case where the condition Q>Pa+Pb is satisfied. The condition, G<Q, is to be met to prevent the foreign substance DUS having such a size Q from getting in or entering, and the condition, G<Pa+Pb<Q, is reasonably satisfied. The distance G can be less than the sum of the pitch Pa between the pixel 140R and one of the two pixels 140R' and 140R" (here, pixel 140R') and the pitch Pb between the pixel 140R and the other of the two pixels 140R' and 140R" (here, pixel 140R") (G<Pa+Pb). Substituting Pa=X+Da and Pb=X+Db into G<Pa+Pb yields G<X+Da+X+Db. To prevent a display defect caused by a foreign substance DUS satisfying the condition, Q>X+Da+X+Db, i.e., a display defect across three pixels of the same color, the condition, Q<X+Da+X+Db, can thus be met. Assuming that foreign substances DUS are spherical, the distance G<Q can prevent foreign substances DUS having a size of Q or greater from entering the opening (gap 250) in the bonding member 200 and causing a display defect. In other words, the condition, G<X+Da+X+Db, is to be met. Substituting Da=Y'+Z and Db=Y+Z' into G<X+Da+X+Db yields G<X+Y'+Z+X+Y+Z'. Applying Y'=Z=X=Y=Z' to G<X+Y'+Z+X+Y+Z' yields G<6×X.

With G<6×X, the distance G is to be less than 48 μm if the pixel size X is 8 μm or less, for example. As measures against foreign substances DUS having a size Q greater than the pixel size X, the distance G is desirably 20 μm or more.

In view of industrially manageable sizes of foreign substances DUS, a distance G of less than 50 µm is sufficient.

A second index is to reduce a display defect across a pixel of interest and pixels of different colors on both sides thereof. In FIG. 5, the range represented by a size Qb corresponds to the size Q of the foreign substance DUS to be examined by the second index. In a case of the size Q=Qb=Da+X+Db, the condition, G<Q, is to be satisfied. In other words, the distance G is desirably less than the distance between the two pixels 140R' and 140R" (G<Da+X+Db) as well. Substituting Da=Y'+Z and Db=Y+Z' into G<Da+X+Db yields G<Y'+Z+X+Y+Z'. Applying Y'=Z=X=Y=Z' to G<Y'+Z+X+Y+Z' yields G<5×X. With the condition, G<5×X, the distance G is to be less than 40 µm if the pixel size X is less than 8 µm.

While foreign substances DUS lying between the light transmission plate 300 and the display device 100 have been described, foreign substances DUS can also adhere to the main surface 320 of the light transmission plate 300. The foreign substances DUS on the main surface 320 can be visually observed by the user. However, if the foreign substances DUS on the main surface 320 are far from the display region 500, the user may not focus on the foreign substances DUS on the main surface 320 when viewing the display region 500, and thus the effect of the presence of the foreign substances DUS can be reduced. To sufficiently separate the main surface 320 from the display region 500, the distance between the main surface 320 and the main surface 310, i.e., the thickness R of the light transmission plate 300, is desirably at least greater than the distance G (R>G). In other words, the distance G can be less than the thickness R of the light transmission plate 300. Since the possibility of presence of foreign substances DUS in the narrow void 180 sealed with the bonding member 200 is lower than that of foreign substances DUS adhering to the main surface 320, satisfying the relationship, R>G, is appropriate as an appropriate measure against foreign substances DUS. While the thickness R can be 0.1 to 1 mm, the distance G can be less than 100 µm.

The greater the area of the display region 500, the higher the probability of presence of foreign substances DUS and the greater the effect of the foreign substances DUS. For example, the length of a side of the display region 500 can be 5 to 50 mm, and the area of the display region 500 can be 25 to 2500 mm$^2$. In consideration of industrial production of the display device 100, the display region 500 desirably has an area less than 2912 mm$^2$. The display region 500 smaller than 2912 mm$^2$ can be formed by batch exposure using a commercially available semiconductor exposure apparatus (i-line stepper "FPA-5510iX" manufactured by Canon Inc., with a maximum exposure range of 52 mm×56 mm). The display region 500 also desirably has an area less than 1392 mm$^2$. The display region 500 smaller than 1392 mm$^2$ can be formed by batch exposure using a commercially available semiconductor exposure apparatus (KrF scanner "FPA-6300ESW" manufactured by Canon Inc., with an exposure range of 33 mm×42.2 mm). The finer structure of the display region 500 smaller than 1392 mm$^2$ can be formed by using the KrF scanner than by using the i-line stepper. The display region 500 may have an area less than 858 mm$^2$. The display region 500 smaller than 858 mm$^2$ can be formed by batch exposure using a commercially available semiconductor exposure apparatus (KrF scanner "FPA-6300ES6a" manufactured by Canon Inc., with an exposure range of 26 mm×33 mm). The display region 500 smaller than 858 mm$^2$ can also be formed by batch exposure using another commercially available semiconductor exposure apparatus (ArF scanner "NSR-5322F" manufactured by Nikon Corporation, with an exposure range of 26 mm×33 mm). The finer structure of the display region 500 smaller than 858 mm$^2$ can be formed by using the ArF scanner than by using the KrF scanner. An exposure apparatus having an exposure range of 26 mm×33 mm can expose display regions 500 of two or more devices by one shot even if the display regions 500 have an area of 214 mm$^2$ or more, thereby yielding high productivity. However, if the long sides of the display regions 500 are 16.5 mm or more, the exposure range by one shot can only accommodate a display region 500 of one device in the 33-mm direction. This can lower the producibility of the display devices 100. The foregoing measures against foreign substances DUS are particularly useful in such a case. If the long side of a display region 500 is 16.5 mm or more and the aspect ratio of the display region 500 is 16:9, the diagonal length is approximately 19.0 mm or more and the area of the display region 500 is 153 mm$^2$ or more. If the long side of the display region 500 is 16.5 mm or more and the aspect ratio of the display region 500 is 4:3, the diagonal length is approximately 20.7 mm or more and the area of the display region 500 is approximately 205 mm$^2$ or more. The present exemplary embodiment is thus suitable for a display apparatus 800 including a display device 100 with a display region 500 of 19 mm or more in diagonal length and a display device 100 with a display region 500 of 153 mm$^2$ or more in area. If the diagonal length of the display region 500 is 24 mm or more and the aspect ratio of the display region 500 is 16:9, the area of the display region 500 is 245 mm$^2$ or more. If the aspect ratio of the display region 500 is 4:3, the area of the display region 500 is 276 mm$^2$ or more. While batch exposure is described to be used in the foregoing description, split exposure (seamless exposure) can be used to form a display region 500 having a large area without limitation on the semiconductor exposure apparatus. Split exposure using an exposure apparatus with an exposure range of 26 mm×33 mm can manufacture a display device 100 having a display region 500 greater than 858 mm$^2$. Since the producibility of display devices 100 having a display region 500 greater than 858 mm$^2$ is even lower, the foregoing measures against foreign substances DUS are even more useful. An exposure apparatus having an exposure range of 26 mm×33 mm, an exposure apparatus having an exposure range of 33 mm×42.2 mm, and an exposure apparatus having an exposure range of 52 mm×56 mm may be used together in the manufacturing steps of a display device 100. Batch exposure and split exposure may be selectively used depending on the manufacturing steps of the display device 100. In view of the presence of the peripheral region 600 around the display device 100, the display device 100 having the display region 500 of the foregoing dimensions can be manufactured by applying an exposure apparatus and an exposure method (batch exposure/split exposure) capable of exposing an area greater than the display region 500.

Figure 3B:
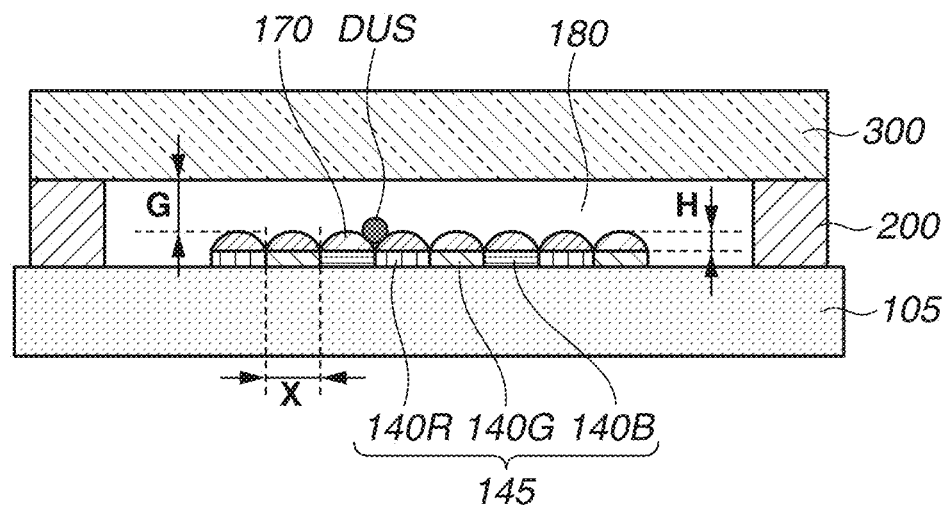

FIG. 3B illustrates a sectional view of the display device 100 where the lens array 170 is provided on the display elements 14 of the pixels 140. Like FIG. 3A, FIG. 3B illustrates only the substrate 105 and the pixels 140 including the lens array 170, with the semiconductor elements and wiring structures of the display device 100 omitted. As illustrated in FIG. 3B, the display device 100 and the light transmission plate 300 are bonded via the bonding member 200. The lens array 170 and the light transmission plate 300 are separated by the distance G, and the void 180 is provided between the lens array 170 and the light transmission plate 300. A display unit 145 includes a set of pixels 140R, 140G, and 140B respectively corresponding to three colors of R, G and B. FIG. 2B is an enlarged view of the display unit 145 in FIGS. 2A and 3B. The lens array 170 includes microlenses, which are provided on the respective pixels 140. The lens array 170 has a height difference H. If the adjoining microlenses are spaced out, the thickness of the lens array 170 corresponds to the height difference H of the lens array 170. If the adjoining microlenses are not spaced out but are in contact with each other, the distance between the high portions 170T and the low portions 170B of the front surface 101 of the lens array 170 corresponds to the height difference H of the lens array 170 as illustrated in FIG. 2B. Suppose that the microlenses of the lens array 170 are hemispheres having the same diameter as the pixel size X (having a height one half of the diameter). In such a case, the height difference H of the lens array 170 can be one half of the pixel size X (H=X/2). However, hemispherical microlenses are optically inefficient and low in producibility. The microlenses are therefore desirably aspherical or smaller than hemispheres. The height difference H of the lens array 170 is thus desirably less than one half of the pixel size X. If such a lens array 170 is used, the height difference H of the front surface 101 in the display region 500 is less than one half of the pixel size X of one of the plurality of pixels 140 constituting the display region 500. The condition, H<X/2, is desirably satisfied.

Foreign substances DUS adhering to the front surface 101 of the display device 100 are washed off before the bonding of the light transmission plate 300. By contrast, small foreign substances DUS caught between the surface bumps of the lens array 170 and smaller than the height difference H cannot removed by washing and remain thereon. As illustrated in FIG. 3B, foreign substances DUS having a size relationship of Q<H with the surface bumps and dips having the height difference H are likely to remain. Suppose that the light transmission plate 300 and the display device 100 are bonded in a state where such a foreign substance DUS has moved to a high portion 170T of the lens array 170. In such a case, the foreign substance DUS can damage the display device 100 if the distance G between the light transmission plate 300 and the lens array 170 is too small. Foreign substances DUS remaining between the surface bumps of the lens array 170 can be prevented from damaging the display device 100 by setting the distance G to be greater than foreign substances DUS having the size relationship of Q<H, i.e., G>H. For example, the height difference H of the lens array 170 is 0.5 to 5 μm, 1 to 3 or 1.5 to 2.5 The distance G is 3 to 10 for example. If the height difference H of the front surface 101 in the display region 500 is ascribable to the lens array 170, an extremely large number of bumps and dips are repeated. The relationship of G>H is therefore desirably satisfied even if the height difference H of the front surface 101 in the display region 500 is 1 μm or less.

Figure 6A:
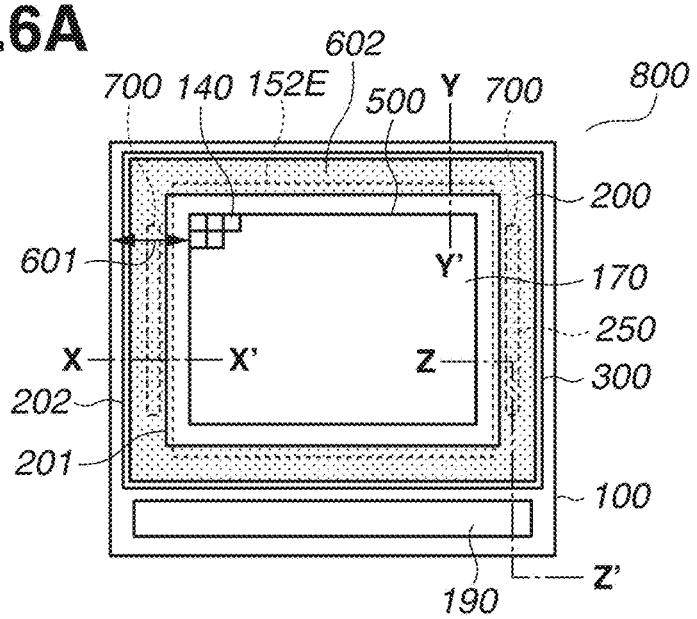
FIGS. 6A, 6B and 6C are schematic diagrams illustrating the display apparatus.
Figure 6B:
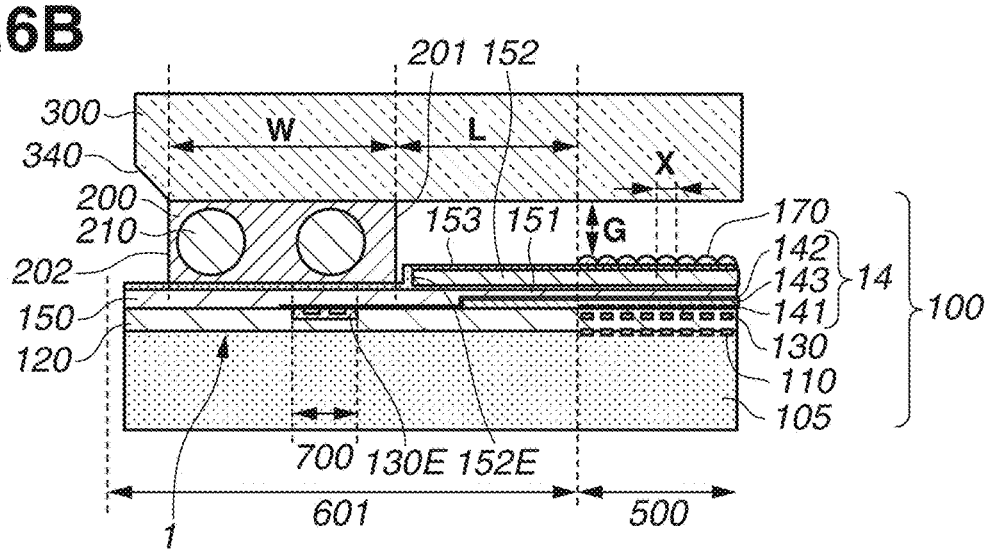
Figure 6C:
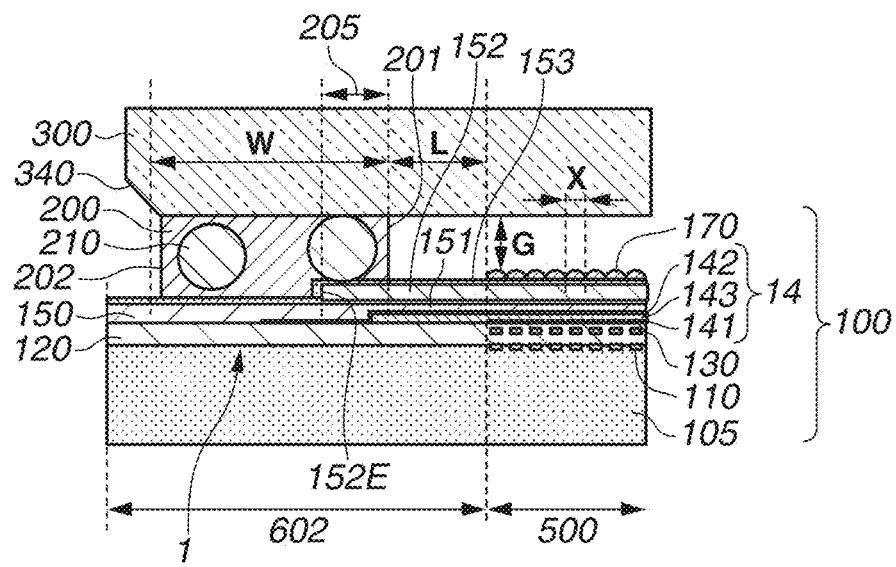

Next, other characteristic configurations of the display apparatus 800 will be described with reference to FIGS. 6A to 6C. As illustrated in FIG. 6A, the plurality of pixels 140 is arranged in the display region 500 of the display device 100. Peripheral regions 601 and 602 are provided around the display region 500. The peripheral regions 601 refer to the peripheral regions on the left and right of the display region 500. The peripheral regions 602 refer to the peripheral regions above and below the display region 500. To suppress reflection in the peripheral regions 601 and 602, the color filter array 152 is also extended to the outside of the display region 500. The outer edge 152E of the color filter array 152 is located on the peripheral regions 601 and 602. In the present exemplary embodiment, contact portions 700 are located in the peripheral regions 601 as illustrated in FIG. 6A. A comparison between the widths of the peripheral regions 601 and 602 shows that the peripheral regions 601 where the contact portions 700 are provided are wider, and the peripheral regions 602 are narrower than the peripheral regions 601. In the present exemplary embodiment, the bonding member 200 is thus placed such that, in the peripheral regions 602, the outer edge 152E of the color filter array 152 overlaps a part of the bonding member 200. An inner edge 201 of the bonding member 200, or the side surface facing the void 180, overlaps the color filter array 152. An outer edge 202 of the bonding member 200, or the side surface opposite the surface facing the void 180, does not overlap the color filter array 152. In other words, the inner edge 201 of the bonding member 200 is provided on the color filter array 152, and the outer edge 202 of the bonding member 200 is provided outside the outer edge 152E of the color filter array 152. By contrast, in the peripheral regions 601 where the contact portions 700 are arranged, both the inner edge 201 and the outer edge 202 of the bonding member 200 are located outside the outer edge 152E of the color filter array 152. FIG. 6B illustrates an X-X' cross section of a structure of the peripheral region 601. FIG. 6C illustrates a Y-Y' cross section of a structure of the peripheral region 602. As illustrated in FIGS. 6B and 6C, the display device 100 includes the substrate 105. Of the front and back surfaces of the substrate 105, the surface where transistors are provided will be referred to as a main surface 1. The semiconductor elements 110, the insulating member 120, and the wiring structures 130 are formed in/on the main surface 1 of the substrate 105. The plurality of pixel electrodes 141, the counter electrode 142 opposed to the plurality of pixel electrodes 141, and the organic material layer 143 interposed between the plurality of pixel electrodes 141 and the counter electrode 142 are provided in/on the insulating member 120. Although omitted here, insulating pixel separation portions (also referred to as banks) may be located between the plurality of pixel electrodes 141. As described above, the display elements 14 of the pixels 140 are EL elements, each including a pixel electrode 141, the organic material layer 143, and the counter electrode 142. In each EL element, the pixel electrode 141 functions as an anode, and the counter electrode 142 as a cathode. The wiring structures 130 are provided between the plurality of pixel electrodes 141 and the substrate 105. The pixel electrodes 141 and the counter electrode 142 are connected with appropriate wiring of the wiring structures 130. As illustrated in FIG. 6B, the contact portions 700 are provided in the peripheral regions 601. In the contact portions 700, the counter electrode 142 is connected to the ground wiring 130E provided in the peripheral regions 601.

The protective film 150 covers the display elements 14 (the counter electrode 142, the organic material layer 143, and the pixel electrodes 141) of the pixels 140, the wiring structures 130, the insulating member 120, and the substrate 105.

The color filter array 152 is provided on the protective film 150 via the resin layer 151. The resin layer 153 is provided on the color filter array 152. In other words, the color filter array 152 is located between the resin layers 151 and 153. The resin layer 151 functions as an adhesive layer, and the resin layer 153 as a planarization layer. The resin layer 153 is provided over the display region 500 and the peripheral regions 601 and 602. The color filter array 152 is provided between the resin layer 153 and the display device 100. If the color filter array 152 is not provided in the peripheral regions 601 and 602, the image quality can drop due to reflection of light at the peripheral regions 601 and 602 and incidence of light on the peripheral regions 601 and 602. The color filter array 152 is thus provided to some extent in the area outside the display region 500. The resin layer 153 covers the side surfaces of the outer edge 152E of the color filter array 152. The resin layers 151 and 153 are stacked on the protective film 150 outside the outer edge 152E of the color filter array 152.

The bonding member 200 is provided in the peripheral regions 601 and 602, and bonds the light transmission plate 300.

To improve the light shielding property of the peripheral region 600, the color filter array 152 can be formed up to the ends of the substrate 105, and the bonding member 200 can be formed on the color filter array 152 to bond the light transmission plate 300. However, the color filter array 152 contains pigments, and the adhesion between the color filter array 152 and the base layer is low. This gives rise to an issue of delamination at the interface between the color filter array 152 and the bonding member 200 and at the interface between the color filter array 152 and the base layer. Such delamination can occur due to a curing shrinkage of the resin in forming the bonding member 200, as well as expansion and contraction when the display apparatus 800 is exposed to a high-temperature high-humidity environment.

In the present example, there is a region not including the color filter array 152 under the bonding member 200 as will be described below. The provision of the region not including the color filter array 152 under the bonding member 200 can prevent delamination between the bonding member 200 and the display device 100 due to a volume shrinkage in curing the bonding member 200. Delamination between the bonding member 200 and the display device 100 due to expansion and contraction of the materials under exposure to a high-temperature high-humidity environment can also be prevented. Delamination between the color filter array 152 and the base layer of the color filter array 152 can be prevented as well. In particular, if the color filter array 152 contains pigments, the adhesion to the members to be bonded is low as compared to a case where the color filter array 152 contains dyes. If the color filter array 152 contains pigments, delamination is likely to occur due to the volume shrinkage in curing the bonding member 200 and the expansion and contraction when the display apparatus 800 is exposed to a high-temperature high-humidity environment. The present example is thus suitable for the case where the color filter array 152 contains pigments.

Next, details of the arranged position of the bonding member 200 will be described. As illustrated in FIG. 6B, the peripheral regions 601 where the contact portions 700 are provided are wider than the peripheral regions 602 where the contact portions 700 are not provided. In the peripheral regions 601, the bonding member 200 is therefore provided outside the outer edge 152E of the color filter array 152. The bonding member 200 is provided between the resin layers 151 and 153 and the light transmission plate 300. In other words, there is a region where the resin layers 151 and 153 extend between the bonding member 200 and the display device 100. As described above, the provision of the region not including the color filter array 152 under the bonding member 200 can prevent delamination between the bonding member 200 and the display device 100 due to the volume shrinkage in curing the bonding member 200. Delamination between the bonding member 200 and the display device 100 due to the expansion and contraction of the materials under exposure to a high-temperature high-humidity environment can also be prevented. Delamination between the color filter array 152 and the base layer of the color filter array 152 can be prevented as well.

By contrast, the peripheral regions 602 where the contact portions 700 are not provided are narrower than the peripheral regions 601, and thus are configured as follows: As illustrated in FIG. 6C, the inner edge 201 of the bonding member 200 is provided on the color filter array 152 formed outside the display region 500. The outer edge 202 of the bonding member 200 is located outside the outer edge 152E of the color filter array 152. The bonding member 200 is located in part between the resin layer 151, color filter array 152 and resin layer 153 and the light transmission plate 300, and located in part between the resin layers 151 and 153 and the light transmission plate 300. There is an overlapping region 205 between the bonding member 200 and the color filter array 152. In other words, there are regions where the resin layers 151 and 153 extend and where the resin layers 151 and 153 and the color filter array 152 extend between the bonding member 200 and the display device 100. Thus providing the bonding member 200 to overlap the color filter array 152 can save space as much as the width of the overlapping region 205 and enables a size reduction of the display device 100. The overlapping region 205 has the foregoing risks of delamination. However, delamination is prevented from developing throughout the bonding member 200 in the width direction since the bonding member 200 is provided in the region not including the color filter array 152 outside the overlapping region 205. As a result, delamination between the bonding member 200 and the display device 100 due to the volume shrinkage in curing the bonding member 200 can be prevented. Delamination between the bonding member 200 and the display device 100 due to the expansion and contraction of the materials under exposure to a high-temperature high-humidity environment can also be prevented. Delamination at the interface between the color filter array 152 and the base layer of the color filter array 152 can be prevented as well.

For example, the bonding member 200 has a width of 0.1 to 2 mm, 0.5 to 1 mm, or 0.8 mm. The distance from the inner edge 201 of the bonding member 200 to the outer edge 152E of the color filter array 152, i.e., the width of the overlapping region 205, is 10 to 500 µm, 50 to 200 µm, or 100 µm, for example. The distance from the outer edge 152E of the color filter array 152 to the outer edge 202 of the bonding member 200 is 0.1 to 1 mm, 0.5 to 1 mm, or 0.7 mm, for example. The bonding member 200 can include a resin matrix and resin spacers dispersed in the matrix. The distance G between the display device 100 and the light transmission plate 300 is adjusted by the particle diameter of the spacers. As illustrated in FIG. 6C, the distance G between the display device 100 and the light transmission plate 300 in the display region 500 can vary with the thickness of the bonding member 200 in the overlapping region 205 of the bonding member 200 and the color filter array 152. The distance G is thus a difference between the spacer diameter and the thickness of the lens array 170. For example, the lens array 170 has a total thickness of 2 µm, and the spacers have a particle diameter of 30 µm. In such a case, the distance G is 28 µm. The matrix resin of the bonding member 200 is in contact with both the display device 100 and the light transmission plate 300. As another example of the bonding member 200, the bonding member 200 may include a base part that occupies most of the thickness of the bonding member 200, an adhesive layer that bonds the base part to the display device 100, and another adhesive layer that bonds the base part to the light transmission plate 300.

The light transmission plate 300 has the slopes 340 formed by chamfering at the ends of the main surface 310 of the light transmission plate 300 opposed to the display device 100. The provision of the slopes 340 can prevent the corners of the light transmission plate 300 from making contact with the display device 100 and damaging the display device 100 thereby in bonding the light transmission plate 300. The width of the slopes 340 in a direction parallel to the main surface 310 is 0.1 mm, for example. In the present example, the slopes 340 are formed only at the ends of the main surfaces 310 opposed to the display device 100. However, slopes may be formed at the ends of the main surface 320 not opposed to the display device 100 by chamfering. Alternatively, slopes may be formed at the ends of both the main surfaces 310 and 320.

Next, a relationship between a width W and a distance L will be described with reference to FIG. 7. In the relationship, W is the width of the bonding member 200 and L is the distance from the outer edge of the display region 500 to at least a part of the bonding member 200. The distance from the outer edge of the display region 500 to the bonding member 200 does not need to be uniform throughout the entire outer edge of the display region 500.

Figure 7:
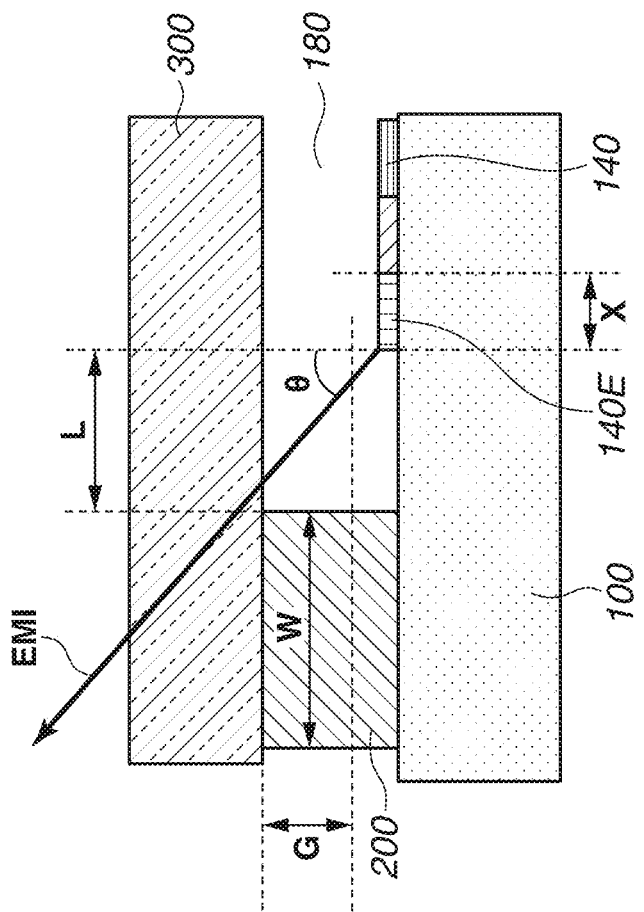
FIG. 7 is a schematic diagram illustrating the display apparatus.

FIG. 7 is a schematic diagram illustrating a state where emission light EMI is emitted from a pixel 140E at the outer edge of the display region 500 at an emission angle of θ. For the sake of simplicity, the lens array 170 is omitted in the diagram. The angle between the normal to the main surface of the display device 100 and the emission light EMI will be defined as the emission angle θ. To prevent the emission light EMI from the pixel 140E at the outer edge of the display region 500 from being blocked by the bonding member 200, the relationship of L>G·tan θ is desirably satisfied. In other words, if the relationship of L≤G·tan θ holds, the emission light EMI from the pixel 140E at the outer edge of the display region 500 can be blocked by the bonding member 200, thereby causing a display defect. It can be seen that the desirable distance L depends on the viewing angle. In typical applications, a viewing angle of approximately 45° is sufficient. If θ=45°, the foregoing equation yields L>G. In other words, the distance L from the display region 500 to at least a part of the bonding member 200 is desirably greater than the distance G. For the sake of space saving, the distance L from the pixel 140E at the outer edge of the display region 500 to the bonding member 200 is also desirably less than the width W of the bonding member 200. In other words, the relationship is desirably W>L. With the foregoing relationship of the pixel size X<G also taken into account, the display apparatus 800 is desirably designed to satisfy the relationship of X<G<L<W. For example, the pixel size X is 5 to 10 the distance G is 10 to 50 the distance L is 50 to 500 and the width W is 500 to 1000 As an example of the display apparatus 800, the pixel size X is 6 the distance G is 28 the distance L is 100 and the width W is 700 μm.

One of the characteristics of the present exemplary embodiment is that the void 180 communicates with a space (external space) on the opposite side of the bonding member 200 from the void 180. For example, as illustrated in FIGS. 8A to 8D, a gap 250 through which the void 180 communicates with the external space is provided between one portion and another of the bonding member 200. One portion and another of the bonding member 200 refer to the portions of the bonding member 200 located on both sides of the gap 250. Aside from the technique of providing the gap 250, a groove or hole through which the void 180 communicates with the external space may be formed in the light transmission plate 300 or the display device 100.

Next, desirable patterns of the bonding member 200 will be described. In the foregoing exemplary embodiment, the bonding member 200 has a closed pattern surrounding the display region 500. However, at least one of one or more gaps 250 can be formed in the bonding member 200. If no gap 250 is provided in the bonding member 200, the pressure in the void 180 varies with a change in the external environment. This can deform the light transmission plate 300 and impair the quality and reliability of the display device 100. For example, if the external environment changes abruptly from room temperature to below freezing, the pressure in the void 180 drops to produce a pressure difference between the inside and outside of the bonding member 200, thereby deforming the light transmission plate 300 toward the display device 100. As described above, a display defect that can be caused by the presence of foreign substances can be prevented by setting the distance G to be greater than the pixel size X. However, the display device 100 can be damaged by the foreign substances inside if the light transmission plate 300 is deformed to change the distance G. The amount of deformation of the light transmission plate 300 is difficult to be defined unconditionally since the amount of deformation also depends on the rigidity of the light transmission plate 300. The deformation itself of the light transmission plate 300 due to changes in the external environment is therefore desirably prevented. If no gap 250 is provided in the bonding member 200 and sharp temperature cycles between high and low temperatures are repeated, the void 180 expands and contracts repeatedly to cause repeated stress at the interfaces of the bonding member 200. This can even cause delamination of the bonding member 200 from the display device 100 or the light transmission plate 300. In particular, as the line width W of the bonding member 200 is smaller, the issue becomes more apparent. There is also an issue of moisture condensation. Suppose that the bonding member 200 has no gap 250, and the pressure in the void 180 reaches the saturation vapor pressure while being left in a high-temperature high-humidity environment, for example. In such a case, a sharp decrease in the ambient temperature lowers the saturation vapor pressure to produce condensation in the void 180. The condensation in the void 180 can impair display quality and reliability. To avoid these issues, the bonding member 200 desirably has at least one of one or more gaps 250. Next, layout patterns of a gap 250 in the bonding member 200 will be described with reference to FIGS. 8A to 8D.

FIGS. 8A to 8D are plan views of the display apparatus 800 including the bonding member 200 having a gap 250 as seen perpendicularly to the front surface 101 that is a main surface of the display device 100.

Figure 8A:
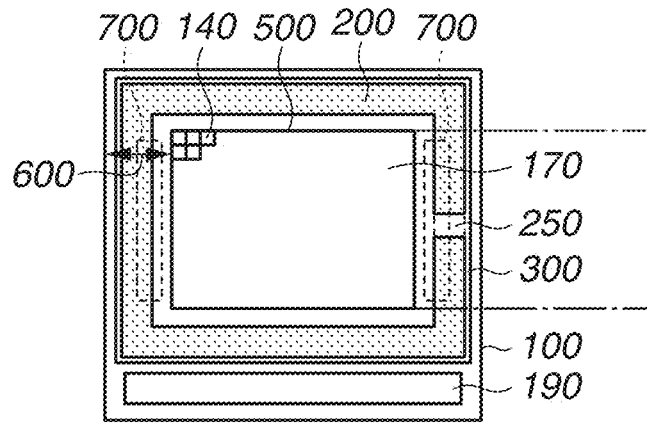
FIGS. 8A, 8B, 8C and 8D are schematic diagrams illustrating a display apparatus.

In FIG. 8A, the gap 250 is provided in a side where a contact portion 700 is located. As illustrated in FIG. 8A, the display region 500 has a rectangular outline, and the gap 250 is located at a position between two straight lines (illustrated in dot-dashed lines) imaginarily extended from the opposed top and bottom sides of the outline. The external connection terminal 190 does not exist at a position between the two straight lines illustrated in the dot-dashed lines. If the bonding member 200 is formed by using a dispensing method, the gap ends of the bonding member 200 corresponding to the dispensing start and end points can have a somewhat large line width compared to the portions other than the gap ends. As described above, the peripheral region 600 is wider on the sides where the contact portions 700 are provided than on the other sides, and the somewhat large line width of the bonding member 200 near the gap 250 does not matter. The gap 250 is thus desirably provided in a side where a contact portion 700 is located.

Figure 8B:
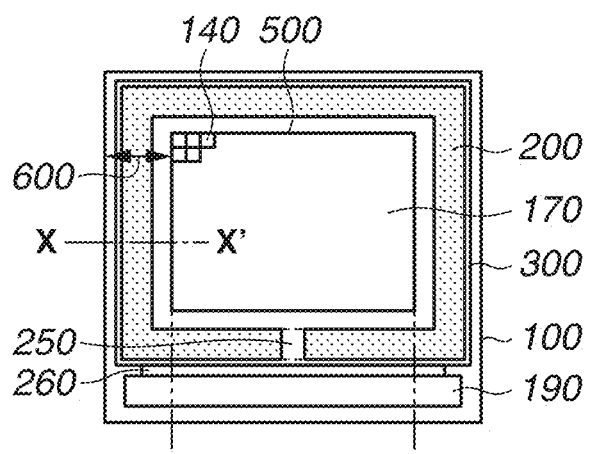

As another example, in FIG. 8B, the gap 250 is provided in the side where the external connection terminal 190 is located. The display region 500 has a rectangular outline, and the gap 250 is located at a position between two straight lines (illustrated in double-dotted dashed lines) imaginarily extended from the opposed left and right sides of the outline. At least a part of the external connection terminal 190 lies at a position between the two straight lines illustrated in the double-dotted dashed lines. To dispose wiring structures, the region between the external connection terminal 190 and the display region 500 is often wider than the other sides. As with the foregoing layout pattern, the gap 250 can thus be easily provided. Since the gap 250 in the bonding member 200 can serve as an entrance of foreign substances, some kind of structure is desirably arranged outside the gap 250 but to not close the gap 250. An FPC board (not illustrated) is bonded to the external connection terminal 190, and reinforcing resin 260 can be provided to reinforce the adhesion between the FPC board and the display device 100. The gap 250 is suitably provided in the side where the external connection terminal 190 is provided because the reinforcing resin 260 for the FPC board can be used as a structure for preventing the intrusion of foreign substances.

Figure 8C:
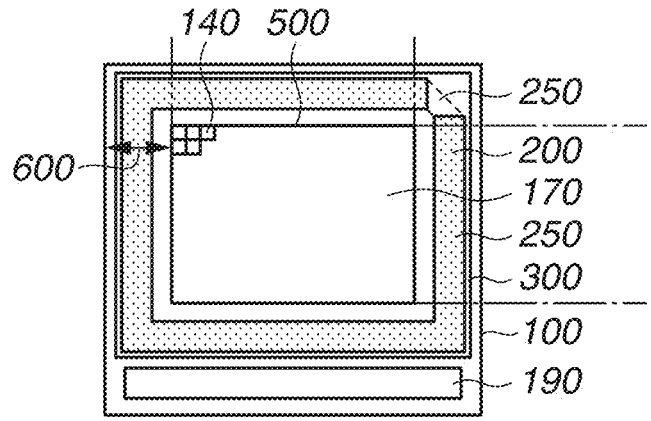

As yet another example, as illustrated in FIG. 8C, the gap 250 may be provided in a corner. The display region 500 has a rectangular outline, and the gap 250 is provided at a position outside the range between two straight lines (illustrated in dot-dashed lines) imaginarily extended from the opposed top and bottom sides of the outline. The gap 250 is provided at a position outside the range between two lines (illustrated in double-dotted dashed lines) imaginarily extended from the opposed left and right sides of the outline, either. providing the gap 250 in a corner can reduce the risk of a display defect that can be caused by foreign substances entering the gap 250 since the distance from the gap 250 to the display region 500 is greater.

Figure 8D:
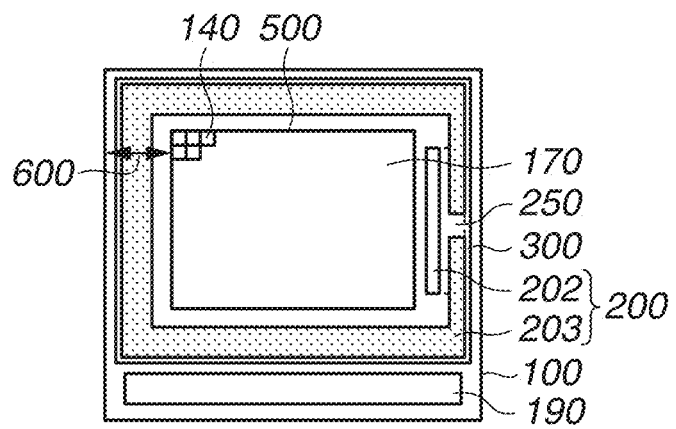

In FIG. 8D, the bonding member 200 is double-patterned. The bonding member 200 includes a bonding member pattern 203 that is arranged around the display region 500 and has a gap 250, and a bonding member pattern 202 that is arranged on the inner side of the bonding member pattern 203 with a space from the bonding member pattern 203. The bonding member pattern 202 is provided to overlap the gap 250 in the bonding member pattern 203 when seen in a plan view. The bonding member pattern 202 may be arranged on the outer side of the bonding member pattern 203. The provision of the bonding member pattern 202 can form the gap 250 in a labyrinth structure to increase the distance for foreign substances entering the gap 250 of the bonding member 200 to reach the display region 500 over. The risk of a display defect can thereby be reduced.

As described above, the provision of the gap 250 in the bonding member 200 can reduce the risks of a display defect and a drop in reliability that can be caused by changes in the external environment.

As described above, according to the present exemplary embodiment, a display defect that can be caused by foreign substances can be prevented by making the distance G between the display device 100 and the light transmission plate 300 greater than the pixel size X. If the display apparatus 800 includes the lens array 170, a display defect that can be caused by foreign substances can be prevented by making the distance G between the display device 100 and the light transmission plate 300 greater than the height difference H of the lens array 170. Moreover, the risks of a display defect and a drop in reliability due to changes in the external environment can be reduced by forming a gap 250 in the bonding member 200. The display quality and reliability of the display apparatus 800 can be improved in such a manner.

In the present exemplary embodiment, the void 180 is provided between the light transmission plate 300 and the display device 100. This is disadvantageous in terms of the bonding strength between the light transmission plate 300 and the display device 100, as compared to the case where the space between the light transmission plate 300 and the display region 500 is filled with a light transmission member. In other words, the bonding area between the light transmission plate 300 and the display device 100 is difficult to be increased because of the provision of the void 180. In addition, the void 180 reduces heat conduction between the display device 100 and the light transmission plate 300, and a temperature difference is more likely to occur between the display device 100 and the light transmission plate 300. Since the display device 100 and the light transmission plate 300 tend to have different amounts of thermal expansion, stress is likely to occur between the display device 100 and the light transmission plate 300. Furthermore, to reduce thermal damage to the organic material layer 143, the resin films constituting the resin layers 151 and 153 are desirably prevented from exposure to high temperature. The resin films can thus sometimes be insufficiently cured. If the display device 100 and the light transmission plate 300 are bonded by the bonding member 200 via the insufficiently-cured resin films, delamination can occur at the interface between the insufficiently-cured resin films and the protective film 150. Delamination can also occur at the interface between the insufficiently-cured resin films and the bonding member 200. The insufficiently-cured resin films themselves can be broken as well. In view of this, a description will be given of configurations advantageous in improving the bonding strength between the light transmission plate 300 and the display device 100 with a limited bonding area.

Figure 9A:
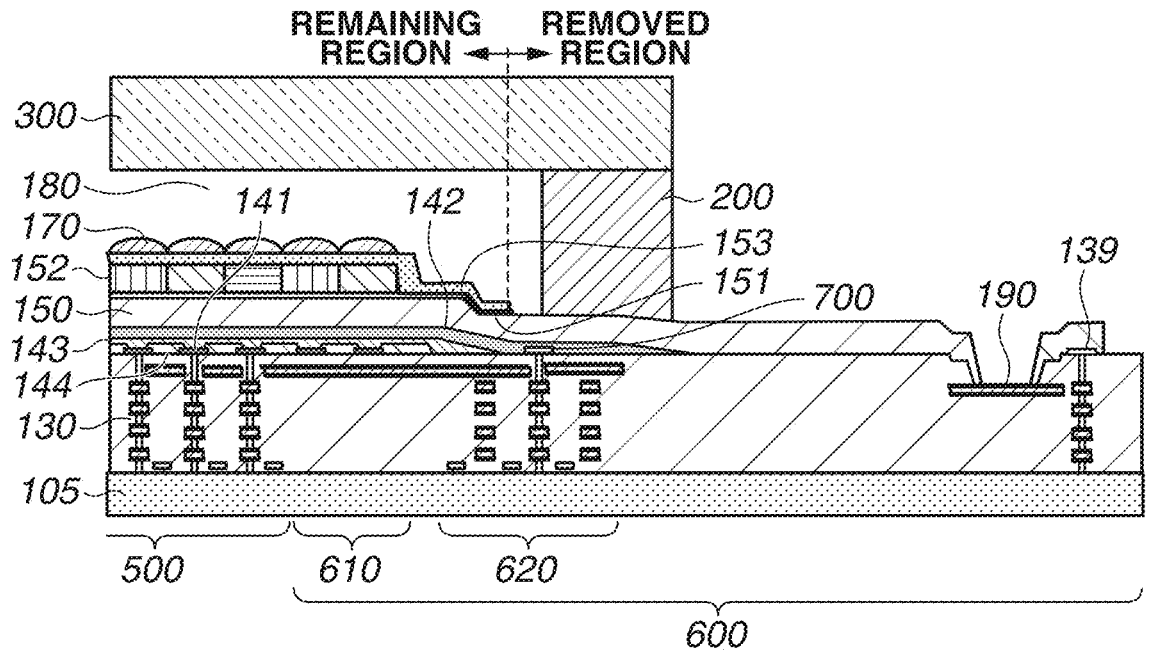
FIGS. 9A and 9B are schematic diagrams illustrating the display apparatus.
Figure 9B:
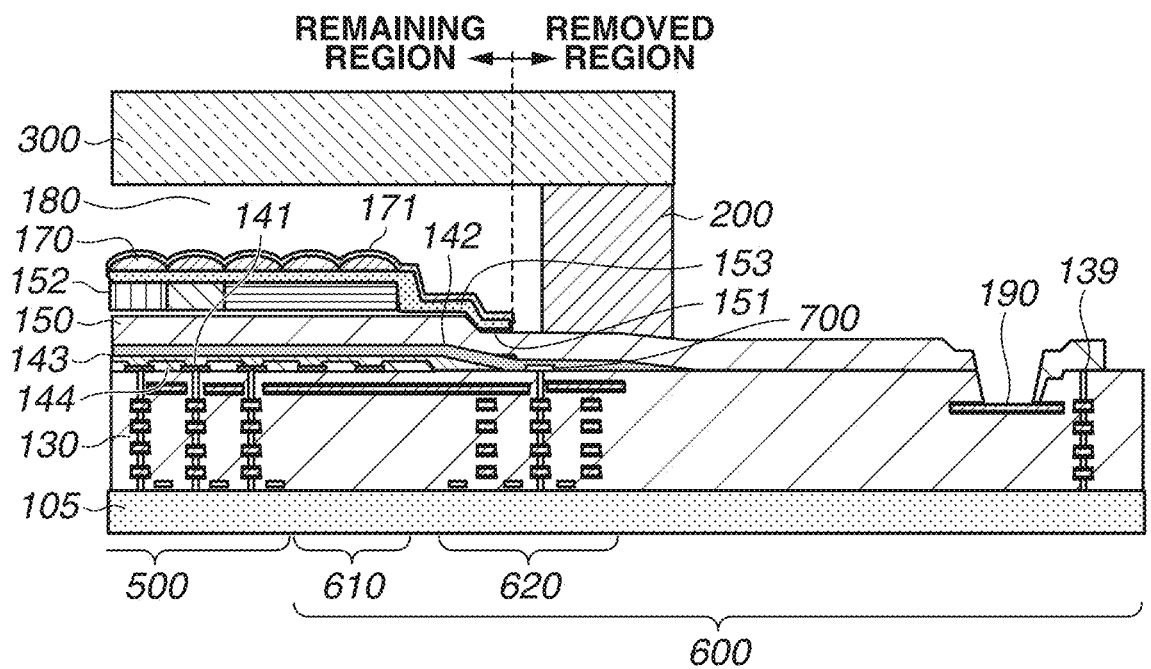

FIGS. 9A and 9B are sectional views taken along the line Z-Z' in FIG. 6A. The display device 100 includes the substrate 105 and an inorganic material layer located between the substrate 105 and the void 180. In FIG. 9A, the inorganic material layer can be included in the protective film 150. The inorganic material layer included in the protective film 150 typically is a silicon nitride layer. The inorganic material layer included in the protective film 150 extends between the bonding member 200 and the substrate 105. The display device 100 includes the organic material layer 143 between the substrate 105 and the inorganic material layer of the protective film 150, and at least one of one resin layer or layers 151 and 153 between the organic material layer 143 and the void 180. The ends of the resin layers 151 and 153 are located on the inner side of the bonding member 200. The resin layers 151 and 153 are formed to expose the inorganic material layer included in the protective film 150. The bonding member 200 is thus in contact with the inorganic material layer included in the protective film 150. Since contact of the bonding member 200 with the resin layers 151 and 153 can lower the bonding strength, the resin layers 151 and 153 are removed so that the bonding member 200 is in contact with the inorganic material layer included in the protective film 150. The absence of the resin layers 151 and 153 between the bonding member 200 and the substrate 105 reduces the possibility of delamination that can be caused by the resin layers 151 and 153.

Such a structure can be formed by forming the resin films constituting the resin layers 151 and 153 over the entire surface of the substrate 105 and then removing the resin films in a removed region illustrated in FIGS. 9A and 9B while leaving the resin films in a remaining region illustrated in FIGS. 9A and 9B. For example, after forming the resin film constituting the resin layer 151 and the resin film constituting the resin layer 153 over the entire surface of the substrate 105, the two resin films in the removed region can be etched off with the remaining region protected by a mask. The needless films are thereby effectively removed together from the removed region. The ends of the resin layers 151 and 153 are thus located at substantially the same position. That the ends are located at substantially the same position means that a difference between the positions of the respective ends is 1 µm or less. Alternatively, each resin film may be removed from the removed region each time the resin film is formed. In such a case, the ends of the resin layers 151 and 153 do not need to be at the same position. If the resin films are photosensitive, each resin film can be patterned by photolithography each time the resin film is formed.

In FIG. 9B, an AR film 171 is provided on the lens array 170. The AR film 171 includes an inorganic material layer such as a silicon oxide layer, a silicon nitride layer, and a silicon oxynitride layer. The organic material layer 143 is provided between the substrate 105 and the inorganic material layer included in the AR film 171. Like the ends of the resin layers 151 and 153, the end of the AR film 171 is located on the inner side of the bonding member 200. The bonding member 200 is therefore in contact with the inorganic material layer included in the protective film 150, not with the inorganic material layer included in the AR film 171. The inorganic material layer included in the AR film 171 can also be patterned together with the resin films constituting the resin layers 151 and 153.

The inorganic material layer included in the AR film 171 may be left in the removed region where the resin layers 151 and 153 are removed. In such a case, the inorganic material layer included in the AR film 171 can be extended between the bonding member 200 and the substrate 105. The bonding member 200 can be in contact with the organic material layer included in the AR film 171. Even in a case where the inorganic metal material layer included in the AR film 171 is left in the removed region where the resin layers 151 and 153 are removed, the bonding strength is advantageously less likely to drop due to the absence of the resin layer 151 or 153 (i.e., the resin layers 151 and 153 are removed) between the inorganic material layer and the substrate 105.

The peripheral region 600 illustrated in FIG. 9A includes a non-effective pixel region 610 and a peripheral circuit region 620. In the example of FIG. 9A, the color filter array 152 in the non-effective pixel region 610 includes a multicolor portion. In the example of FIG. 9B, the color filter array 152 in the non-effective pixel region 610 includes a single-color portion. FIGS. 9A and 9B illustrate pixel isolation portions 144 called banks. The pixel isolation portions 144 are made of an inorganic material layer such as a silicon oxide layer and a silicon nitride layer. The inorganic material layer constituting the pixel isolation portions 144 may be provided between the substrate 105 and the bonding member 200. The peripheral region 600 of the substrate 105 also includes a contact portion 139 electrically connected to the wiring structure 130 through a via plug.

Figure 10A:
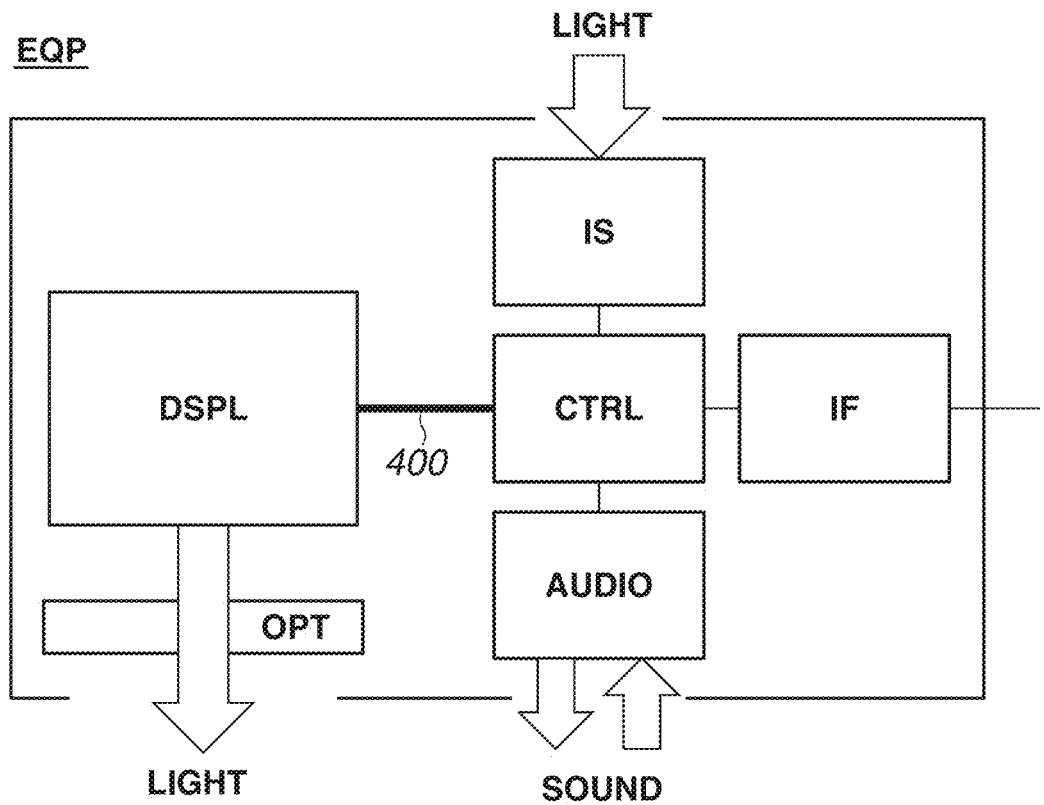
FIGS. 10A and 10B are schematic diagrams illustrating equipment.

FIG. 10A illustrates an example of equipment EQP including a display apparatus DSPL. The foregoing display apparatus 800 can be applied to the display apparatus DSPL. The equipment EQP includes at least any one of: a control apparatus CTRL, a communication apparatus IF, an optical apparatus OPT, an imaging apparatus IS, and an audio apparatus AUDIO. The control apparatus CTRL controls the display apparatus DSPL. The control apparatus CTRL can be a digital signal processor (DSP) or an application specific integrated circuit (ASIC). The communication apparatus IF communicates (transmits/receives) a signal including information to be displayed on the display region 500. The communication apparatus IF includes a wireless communication function and/or a wired communication function. The communication apparatus IF may include only a reception function without a transmission function. The optical apparatus OPT projects an image displayed on the display region 500 upon a screen or the retina. The optical apparatus OPT can be a lens, a prism, or a mirror. The imaging apparatus IS captures the image to be displayed in the display region 500. The imaging apparatus IS can be a complementary metal-oxide-semiconductor (CMOS) image sensor for photoelectrically converting light input from outside the equipment EQP. The audio apparatus AUDIO can include a microphone for inputting sound from outside the equipment EQP and/or a speaker for outputting sound. In particular, the imaging apparatus IS and the sound apparatus AUDIO can be omitted as appropriate depending on the specification of the equipment EQP and the users' demand.

The equipment EQP is suitable for electronic devices such as information terminals having a display function (for example, a smartphone and a wearable terminal) and cameras (for example, a lens interchangeable camera, a compact camera, a video camera, and a surveillance camera). The equipment EQP can be a transport apparatus such as a vehicle, a ship, and a flight vehicle. The equipment EQP serving as a transport apparatus is suitable for one that transports the display apparatus 800 and one for assisting driving (maneuvering) using the display function. Alternatively, the equipment EQP may be an ophthalmologic or other medical instrument, a measurement instrument such as a ranging sensor, or an office equipment such as a copying machine.

Figure 10B:
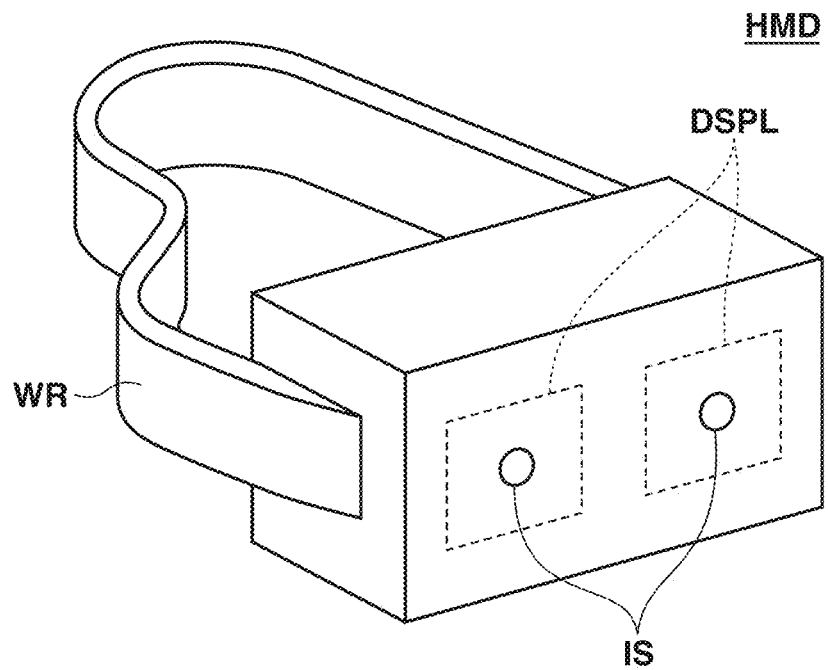

FIG. 10B illustrating an example of a head-mounted display HMD that is an example of the equipment EQP. The head-mounted display HMD includes a wearing unit WR for using the equipment EQP as a head-mounted display. Examples of the wearing unit WR include a band and a strap. The head-mounted display HMD includes a plurality of display apparatuses DSPL such that the user can observe images with both eyes. The head-mounted display HMD also includes a plurality of imaging apparatuses IS such that distance information can be obtained. An audio apparatus AUDIO includes a microphone located near the user's mouth so that a voice uttered from the user's mouth can be input to the microphone. The audio apparatus AUDIO includes speakers located near the user's ears so that sound can be output from the speakers to the user's ears. The display regions of the display apparatuses DSPL in the head-mounted display HMD may have a diagonal length of 24 mm or more.

Modifications can be made to the foregoing exemplary embodiments as appropriate without departing from the technical concept. The disclosure of the present specification is not limited to the description of the present specification, and covers all items comprehensible from the present specification and the drawings accompanying the present specification.

In the foregoing specific numerical ranges, a notation "e to f" (e and f are numbers) refers to greater than or equal to e and/or less than or equal to f. In the foregoing specific numerical ranges, if a range of i to j and a range of m to n (i, j, m, and n are numbers) are written together, the set of lower and upper values is not limited to the set of i and j and the set of m and n. For example, the lower and upper limits in the plurality of sets may be examined in combination. More specifically, if the range of i to j and the range of m to n are written together, a range of i to n or a range of m to j may be examined.

The disclosure of the present specification includes the complementary set of the individual concepts described in the present specification. More specifically, if the present specification describes that "A is greater than B" and omits the description that "A is not greater than B", the present specification can be said to disclose that "A is not greater than B". The reason is that "A is greater than B" is predicated on consideration of the case where "A is not greater than B".

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2020-112432, filed Jun. 30, 2020, which is hereby incorporated by reference herein in its entirety.

What is claimed is:

1. A display apparatus comprising:
a display device including a display region and a front surface residing on the display region;
a light transmission plate overlapping the display device and having a main surface; and
a void provided between the display device and the light transmission plate,
wherein the front surface is uneven and varies over a height difference H between a vertex of high portions and a nadir of low portions, and the void has a void thickness G as measured between the vertex of the front surface to the main surface, and
wherein, as a measure against foreign substances that are located in the void and have a shape of a sphere with a diameter of Q, the height difference H over which the front surface varies is set to be greater than 1 μm and the void thickness G is set as a function of the height difference H and the diameter Q of the foreign substances where the following is satisfied: $Q \leq H < G$.

2. The display apparatus according to claim 1,
wherein the display region includes a plurality of pixels, a width of at least one pixel of the plurality of pixels is a size X, and the front surface resides on the plurality of pixels, and
wherein the height difference H over which the front surface varies and the void thickness G are further set as a function of the size X of the at least one pixel where the following is satisfied:
$Q \leq X < G$, and
$H < X/2$.

3. The display apparatus according to claim 2,
wherein the at least one pixel has a first color,
wherein, in a width direction in which the at least one pixel has the size X, (i) the at least one pixel is located between two pixels having the first color, and (ii) two pixels having a second color and two pixels having a third color are provided between the two pixels having the first color, and
wherein the void thickness G is less than a sum of a pitch Pa between the at least one pixel having the first color and one of the two pixels having the first color and a pitch Pb between the at least one pixel having the first color and the other of the two pixels having the first color.

4. The display apparatus according to claim 2,
wherein the at least one pixel has a first color,
wherein, in a width direction in which the at least one pixel has the size X, (i) the at least one pixel is located between two pixels having the first color, and (ii) two pixels having a second color and two pixels having a third color are provided between the two pixels having the first color, and
wherein the void thickness G is less than a distance between the two pixels having the first color.

5. The display apparatus according to claim 2,
wherein the at least one pixel has a first color,
wherein, in a width direction in which the at least one pixel has the size X, the at least one pixel is located between one pixel having a second color and one pixel having a third color, and
wherein the void thickness G is greater than a sum of the size X of the at least one pixel having the first color, a width of the at least one pixel having the second color in the width direction, and a width of the at least one pixel having the third color in the width direction.

6. The display apparatus according to claim 1, wherein the void thickness G is less than a thickness R of the light transmission plate.

7. The display apparatus according to claim 1, wherein the void thickness G is 40 μm or less.

8. The display apparatus according to claim 1, wherein the void thickness G is 10 μm or less.

9. The display apparatus according to claim 1, wherein the void thickness G is 20 μm or more.

10. The display apparatus according to claim 1,
wherein the display device includes a peripheral region around the display region, and
wherein a bonding member configured to bond the display device and the light transmission plate is provided between the peripheral region and the light transmission plate.

11. The display apparatus according to claim 10, wherein a distance L from the display region to at least a part of the bonding member is greater than the void thickness G and less than a width W of the bonding member.

12. The display apparatus according to claim 10, wherein the bonding member includes a resin portion and a spherical spacer.

13. The display apparatus according to claim 10, wherein a conductor film is provided across the display region and the peripheral region, and the bonding member overlaps the conductor film.

14. The display apparatus according to claim 10,
wherein the display device includes a color filter array, and
wherein a side surface of the bonding member on the void side overlaps the color filter array, and a side surface of the bonding member opposite the void side does not overlap the color filter array.

15. The display apparatus according to claim 10,
wherein the display device further includes a substrate, an inorganic material layer between the substrate and the void, and at least one resin layer between an organic material layer and the void, and wherein the inorganic material layer extends between the bonding member and the substrate, and the bonding member is in contact with the inorganic material layer.

16. The display apparatus according to claim 15, wherein no resin layer is located between the bonding member and the substrate.

17. The display apparatus according to claim 15, wherein the inorganic material layer is a silicon nitride layer.

18. The display apparatus according to claim 15, wherein the substrate is a monocrystalline semiconductor substrate and has a thickness greater than a thickness of the light transmission plate.

19. The display apparatus according to claim 15,
wherein the display device includes a color filter array, and
wherein a first resin layer among the at least one resin layer is provided between the color filter array and the void.

20. The display apparatus according to claim 19, wherein a second resin layer among the at least one resin layer is provided between the color filter array and the inorganic material layer.

21. The display apparatus according to claim 1, wherein the display device includes a lens array having the front surface of the display device.

22. The display apparatus according to claim 1, wherein the display device includes a color filter array.

23. The display apparatus according to claim 1, wherein the display device includes a color filter array and a lens array between the color filter array and the void.

24. The display apparatus according to claim 1, wherein the light transmission plate includes a surface sloped with respect to a side surface and the main surface of the light transmission plate, the sloped surface extending from the side surface to the main surface.

25. The display apparatus according to claim 1, wherein the display region has an area greater than 153 mm$^2$ and less than 2912 mm$^2$.

26. The display apparatus according to claim 1, wherein a plurality of organic electroluminescence (EL) elements is arranged in the display region.

27. A display apparatus comprising:
a display device including a display region having a plurality of pixels and including a front surface residing on the display region;
a light transmission plate overlapping the display device and having a main surface; and
a void provided between the display device and the light transmission plate,
wherein a width of at least one pixel of the plurality of pixels is a size X, and the void has a void thickness G as measured between a vertex of the front surface to the main surface, and
wherein, as a measure against foreign substances that are located in the void and have a shape of a sphere with a diameter of Q, the void thickness G is set as a function of the size X of the at least one pixel and the diameter Q of the foreign substances where the following is satisfied: $Q \leq X < G$.

28. A module comprising:
the display apparatus according to claim 1; and
a wiring member,
wherein the display device includes a terminal at a position not overlapping the light transmission plate in a direction in which the display device and the light transmission plate overlap, and the wiring member is connected to the terminal.

29. A module comprising:
the display apparatus according to claim 1;
a light shielding member; and
a light transmission member,
wherein the light shielding member surrounds a space between the light transmission member and the light transmission plate.

* * * * *